US007302443B2

(12) United States Patent
Nakajima et al.

(10) Patent No.: US 7,302,443 B2
(45) Date of Patent: Nov. 27, 2007

(54) PARTS LIST SYSTEM WHICH GENERATES AND MANAGES A PARTS LIST SIMPLY AND EFFECTIVELY

(75) Inventors: Mamoru Nakajima, Saitama (JP);
Masataka Yamamoto, Saitama (JP);
Naoki Saitou, Saitama (JP); Katsunori Taguchi, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 909 days.

(21) Appl. No.: 10/385,920

(22) Filed: Mar. 11, 2003

(65) Prior Publication Data

US 2003/0187870 A1 Oct. 2, 2003

(30) Foreign Application Priority Data

Mar. 26, 2002 (JP) ............................. 2002-087204

(51) Int. Cl.
*G06F 19/00* (2006.01)
*G06F 17/00* (2006.01)
(52) U.S. Cl. ..................... 707/102; 707/10; 700/97; 700/98; 700/105; 700/107
(58) Field of Classification Search ................. 700/97, 700/98, 99, 105, 106, 107, 108, 182; 705/8, 705/10, 28, 29; 702/182; 703/1, 6, 13, 14; 707/1, 10, 100, 101, 102, 104.1
See application file for complete search history.

(56) References Cited

U.S. PATENT DOCUMENTS 5,119,307 A 6/1992 Blaha et al.

(Continued)

FOREIGN PATENT DOCUMENTS

EP 0 467 257 A2 1/1992

(Continued)

OTHER PUBLICATIONS

Shaw C. Feng, Manufacturing Planning and Execution Software Interfaces, 2000, Journal of Manufacturing Systems, vol. 19/No.
Shaw C. Feng, Manufacturing Planning and Execution Software Interfaces, 2000, Journal of Manufacturing Systems, vol. 19, No. 1.

*Primary Examiner*—Leo Picard
*Assistant Examiner*—Charles Kasenge
(74) *Attorney, Agent, or Firm*—Carrier, Blackman & Associates, P.C.; Joseph P. Carrier; William D. Blackman

(57) ABSTRACT

A parts list system includes a CAD section and a parts list section. The CAD section generates a CAD figure of a part included in an apparatus based on design reference data, and extracts a part number of the part, configuration part numbers of configuration parts of the part and attribute data from the CAD figure. Here, the design reference data is reference for design. The attribute data indicate properties of the part and the configuration parts. The parts list section generates the parts list based on the part number, the configuration part numbers and the attribute data from the CAD figure and the design reference data. Here, the parts list relates the part number, the configuration part numbers and part data. The part data indicate properties of the part and the configuration part. Then, the CAD section modifies the CAD figure based on a modification command showing a modified design, and extracts the part number, the configuration part numbers and the attribute data from the modified CAD figure. The parts list section modifies the parts list, based on the part number, the configuration part numbers and the attribute data from the modified CAD figure.

23 Claims, 20 Drawing Sheets

U.S. PATENT DOCUMENTS

| | | | |
|---|---|---|---|
| 5,202,836 A | 4/1993 | Iida et al. | |
| 5,539,652 A * | 7/1996 | Tegethoff | 703/13 |
| 5,742,288 A | 4/1998 | Nishizaka et al. | |
| 5,777,877 A | 7/1998 | Beppu et al. | |
| 5,822,210 A | 10/1998 | Kobayashi et al. | |
| 5,838,965 A | 11/1998 | Kavanaugh et al. | |
| 5,864,875 A | 1/1999 | Van Huben et al. | |
| 6,185,476 B1 | 2/2001 | Sakai | |
| 6,223,094 B1 | 4/2001 | Muehleck et al. | |
| 6,256,549 B1 | 7/2001 | Romero et al. | |
| 6,336,053 B1 | 1/2002 | Beatty | |
| 6,438,535 B1 | 8/2002 | Benjamin et al. | |
| 6,493,679 B1 * | 12/2002 | Rappaport et al. | 705/28 |
| 6,557,002 B1 | 4/2003 | Fujieda et al. | |
| 6,625,454 B1 * | 9/2003 | Rappaport et al. | 703/21 |
| 6,662,179 B2 | 12/2003 | Benjamin et al. | |
| 7,096,173 B1 * | 8/2006 | Rappaport et al. | 703/1 |
| 2001/0007997 A1 | 7/2001 | Fujieda | |
| 2001/0016803 A1 | 8/2001 | Sartiono et al. | |
| 2001/0023376 A1 * | 9/2001 | Uchida et al. | 705/8 |
| 2002/0006799 A1 * | 1/2002 | Rappaport et al. | 455/446 |
| 2002/0032611 A1 | 3/2002 | Kahn | |
| 2003/0004988 A1 | 1/2003 | Hirasawa et al. | |
| 2003/0055812 A1 | 3/2003 | Williams et al. | |
| 2003/0084019 A1 | 5/2003 | Woodmansee | |
| 2003/0187870 A1 | 10/2003 | Nakajima et al. | |
| 2003/0212766 A1 | 11/2003 | Giles et al. | |
| 2004/0098292 A1 | 5/2004 | Miller et al. | |

FOREIGN PATENT DOCUMENTS

| | | |
|---|---|---|
| EP | 0895170 | 2/1999 |
| GB | 2234097 | 1/1991 |
| GB | 2364801 | 2/2002 |
| JP | 62-062377 U | 3/1987 |
| JP | 02-171860 | 7/1990 |
| JP | 06-004604 | 1/1994 |
| JP | 06-162036 | 6/1994 |
| JP | 08-272838 | 10/1996 |
| JP | 09-128429 | 5/1997 |
| JP | 09-204449 | 8/1997 |
| JP | 09-245063 | 9/1997 |
| JP | 10-124550 | 5/1998 |
| JP | 10124550 | 5/1998 |
| JP | 10-240787 | 9/1998 |
| JP | 10-301972 | 11/1998 |
| JP | 10-320436 | 12/1998 |
| JP | 2001022811 A | 1/2001 |
| JP | 2001-195442 | 7/2001 |
| JP | 2001-202392 | 7/2001 |
| JP | 2001-297116 | 10/2001 |
| JP | 2001-306630 | 11/2001 |
| JP | 2001-325310 | 11/2001 |
| JP | 2002-024301 | 1/2002 |
| JP | 2002-073708 | 3/2002 |
| WO | WO 03/038688 | 5/2003 |

* cited by examiner

Fig. 4

| 28 | 29 | 30 | 31 | 32 | 33 | 34 | 35 | 36 | 37 |
|---|---|---|---|---|---|---|---|---|---|
| HIERARCHY | STATE | ITEM | STATUS A | PART NUMBER | STATUS B | FIGURE FLAG | PACKAGE | STATUS C | TOTAL FLAG |
| | | | | | | | | | |

21-3'

| 38 | 39 | 40 | 41 | 42 | 43 | 44 |
|---|---|---|---|---|---|---|
| APPLICATION HEADER | STATUS D | APPLICATION | PART CONFIGURATION | CONFIGURATION NUMBER | CONFIGURATION PART NUMBER | LINK |
| | | | | | | |

Fig. 5

| STATUS A | STATUS B | STATUS C | STATUS D | FIGURE FLAG | TOTAL FLAG | STATE |
|---|---|---|---|---|---|---|
| 61 | 62 | 63 | 64 | 65 | 66 | 67 |

| No. | L/O UI NUMBER | LAYOUT NAME | LINK ID | SHAPE | LOCATION | ROCATION | ACTIVE | SHOW HIDE |
|---|---|---|---|---|---|---|---|---|
| 1 | 68100-S03A-A000 | TAIL GATE COMP | | EXACT | 3624,0,1021 | 0.0.0 | ACTIVE | SHOW |
| 2 | 68100-S03A-ZZ00 | TAIL GATE COMP | | DRAWING | | 0.0.0 | PASSIVE | HIDE |
| 3 | ***-*-*** | HINGE CENTER SECTION(-3.45B) | | SECTIONER | | 0.0.0 | PASSIVE | SHOW |
| 4 | ***-*-*** | UPPER SECTION(0B) | | SECTIONER | | 0.0.0 | PASSIVE | SHOW |
| 5 | ***-*-*** | UPPER SECTION(-3.68B) | | SECTIONER | | 0.0.0 | ACTIVE | SHOW |
| 6 | ***-*-*** | UPPER SECTION(-3.7B) | | SECTIONER | | 0.0.0 | PASSIVE | HIDE |
| 7 | ***-*-*** | UPPER SECTION(-3.25B) | | SECTIONER | | 0.0.0 | PASSIVE | HIDE |
| 8 | 68623-S03A-A000 | STIFF,R TAIL GATE HINGE | 1 | MIRROR | 3624,0,1021 | 0.0.0 | PASSIVE | SHOW |
| 9 | 914-081603-08 | NUT SQUARE 6mm | 1 | MIRROR | 3624,0,1021 | 0.0.0 | PASSIVE | SHOW |
| 10 | 68623-S03A-A000 | STIFF,L TAIL GATE HINGE | | EXACT | 3624,0,1021 | 0.0.0 | PASSIVE | SHOW |
| 11 | 91414-081603-08 | NUT SQUARE 6mm | 0 | EXACT | 3624,0,1021 | 0.0.0 | PASSIVE | SHOW |

Fig. 8A

|   | A |   |   | B |   |   |
|---|---|---|---|---|---|---|
|   | 20E | 20T | 25S | 20E | 20T | 25S |
| MT | ○ | ○ | ○ | ○ | ○ | ○ |
| AT |   | ○ | ○ |   | ○ | ○ |
| SRS | ○ | ○ | ○ | ○ | ○ | ○ |
| ABS |   | ○ | ○ |   | ○ | ○ |
| C/C |   | F | ○ |   |   | ○ |

Fig. 8B

|   | 20E | 20T | 20T | 20T | 20T | 25S | 25S |
|---|---|---|---|---|---|---|---|
| MT | ○ | ○ | ○ |   |   | ○ |   |
| AT |   |   |   | ○ | ○ |   | ○ |
| SRS | ○ | ○ | ○ | ○ | ○ | ○ | ○ |
| ABS |   | ○ | ○ | ○ | ○ | ○ | ○ |
| C/C |   |   | ○ |   | ○ | ○ | ○ |
|   | 00 | 21 | 22 | 31 | 32 | 24 | 34 |

Fig. 11

PARTS LIST SYSTEM WHICH GENERATES AND MANAGES A PARTS LIST SIMPLY AND EFFECTIVELY

BACKGROUND OF THE INVENTION

1. Field of the Invention

The present invention relates to a system of a parts list that manages data of parts used in a product. More particularly, the present invention relates to a system that controls generating and managing a parts list, and linkage between it and other data.

2. Description of the Related Art

A parts list is known as a list to manage the data of the parts used for an apparatus that is constituted by a number of parts, such as an automobile and an motorcycle.

The part data includes the configuration of main-parts and sub-parts included in each item constituting the apparatus, the number of the parts, the data peculiar to the part such as a design change history of the part, the parts combination in the apparatus, the usage situation and the like. Here, a main-part is a part constituting the apparatus, and a sub-part is a part constituting the main-part.

The parts list manages the part data for each part.

In designing an apparatus such as an automobile provided with a number of complex parts, the parts are managed by using a parts list system. Here, the parts list system is the system for carrying out a data process with regard to the generation and the management of a parts list.

A conventional parts list system strictly carries out the management of the design change and its history of the parts in a parts list at a designing stage. For this reason, the data of the parts at the concept stage, which is the former stage of the designing stage, can not be directly used for the parts list at the designing stage. Thus, the data in the parts list at the concept stage can not be continuously transferred to the parts list at the designing stage. Consequently, the data of the parts can not be unitarily managed from the concept stage through the designing stage to the stage of the completion of the figure. That is, a designer, although generating and maintaining the data of the parts at the concept stage, needs to generate a new parts list so that the data is reflected in the parts list at the designing stage. Therefore, the data in the concept stage has not been systemically linked the data in the designing stage.

Also, the parts list at the concept stage is disclosed to only limited persons recognized as the important persons by the designer, since the data is not shared with other departments. The other designers and the persons in the other departments can not access it at that stage. They access the parts list from the designing stage. Thus, the consideration of contents and the generation of opinions and requests for them are started at that time. Hence, it takes a long time to reflect the opinion and the request to the parts list.

A technique is desired which can unitarily manage the data of the parts from the concept stage to the stage of the completion of the figure. A technique is desired which can obtain wide opinions from persons concerned in a development at suitable timings.

SUMMARY OF THE INVENTION

Therefore, an object of the present invention is to provide a parts list system that can unitarily manage the data of the parts from the concept stage to the completion of the figure.

Another object of the present invention is to provide a parts list system that enables persons concerned in a development to share data and also enables the development to be advanced simultaneously and parallel.

Still another object of the present invention is to provide a parts list system that can disclose data regarding the development to persons concerned in the development without any omission, and can obtain wide opinions from those persons at suitable timings.

Yet still another object of the present invention is to provide a parts list system that can generate a parts list, figures of respective parts, layouts of the respective parts with the support of designers and can establish an electronic relation to other data.

It is also another object of the present invention to provide a parts list system that can integrally manage data of parts corresponding to one automobile with regard to a development.

It is also still another object of the present invention to provide a parts list system in which it is possible to transfer the data in a parts list at a concept stage continuously to a parts list at a designing stage and then use it.

In order to achieve an aspect of the present invention, the present invention provides a parts list system including a CAD section and a parts list section.

The CAD section generates a CAD figure of a part included in an apparatus based on design reference data. The CAD section extracts a part number of the part, configuration part numbers and attribute data from the CAD figure. Here, the design reference data is references for designing the apparatus. The configuration part numbers are part numbers of configuration parts of the part. The attribute data indicate properties of the part and the configuration parts.

The parts list section generates a parts list of the apparatus based on the part number, the configuration part numbers and the attribute data extracted from the CAD figure, and the design reference data. Here, the parts list relates the part number, the configuration part numbers and part data. The part data indicate properties of the part and the configuration part and include the attribute data.

The CAD section modifies the CAD figure based on a modification command. Then, the CAD section extracts the part number, the configuration part numbers and the attribute data from the modified CAD figure. The modification command indicates a command for modifying design of the part and is inputted through a network when the parts list section discloses the parts list on the network.

The parts list section modifies the parts list, based on the part number, the configuration part numbers and the attribute data extracted from the modified CAD figure.

In the parts list system, the CAD section extracts another part number of another part, other configuration part numbers and other attribute data from another CAD figure. Here, the other configuration part numbers are part numbers of other configuration parts of the another part. The other attribute data indicate properties of the another part and the other configuration parts.

The parts list section modifies the parts list based on the another part number, the other configuration parts number and the another attribute data extracted from the another CAD figure, and the design reference data. Here, the parts list relates the another part number, the other configuration part numbers and the other part data.

The parts list system of the present invention further includes a layout interface database and a layout section.

The layout interface database stores layout need data relating the part number, the part data, and position and range of the part arranged in the apparatus.

The layout section generates layout data indicating a layout of the part in the apparatus, based on the part number, the part data and the layout need data.

Then, the parts list section modifies the parts list based on the layout data.

The parts list system of the present invention further includes an analysis database and an analysis section.

The analysis database stores an analysis method related to the part.

The analysis section analyzes the part arranged in the apparatus by using the analysis method, based on the parts list and the layout data.

Then, the CAD section modifies the CAD figure based on the analysis result, and extracts the part number, the configuration part numbers and the attribute data from the modified CAD figure.

Then, the parts list section modifies the parts list based on the part number, the configuration part numbers and the attribute data extracted from the modified CAD figure.

The parts list system of the present invention further includes a cost database and an evaluation section.

The cost database stores cost data relating the part data and costs related to manufacturing the part.

The evaluation section estimates manufacture cost of the part, based on the part data and the cost data.

Then, the CAD section modifies the CAD figure based on the manufacture cost, and extracts the part number, the configuration part numbers and the attribute data from the modified CAD figure.

Then, the parts list section modifies the parts list, based on the part number, the configuration part numbers and the attribute data extracted from the modified CAD figure.

The parts list system of the present invention further includes a verification section.

The verification section generates an entire layout data, based on the parts list and the layout data of all parts. Here, the entire layout data indicates a layout of all the parts in the apparatus.

Then, the CAD section modifies the CAD figure of a certain part of all the parts based on the entire layout data, and extracts the part number, the configuration part numbers and the attribute data regarding the certain part from the modified CAD figure. Here, the certain part should be a changed design, based on the entire layout data.

Then, the parts list section modifies the parts list based on the part number, the configuration part numbers and the attribute data extracted from the modified CAD figure.

The parts list system of the present invention further includes a figure output section.

The figure output section inspects the part numbers in the parts list, based on a rule for preparing the part number. Then, it generates an output figure interface based on a plurality of packages. Then, it outputs CAD figures for each package. Here, the output figure interface is generated by reconfiguring the parts list based on the plurality of packages. The plurality of packages are groups including a plurality of the parts and is generated by dividing the all parts into the groups.

In order to achieve another aspect of the present invention, the present invention provides a parts list generating method including the steps of (a1) to (d1).

(a1) step generates a parts list of an apparatus, based on design reference data. Here, the parts list relates a part number, configuration part numbers and part data. The part is included in the apparatus. The configuration part numbers are part numbers of configuration parts of the part. The part data indicate properties of the part and the configuration parts. The design reference data are references for designing the apparatus.

(b1) step generates a CAD figure of the part, based on the design reference data and the part number, and extracts the part number, the configuration part numbers and the attribute data from the CAD figure. Here, the CAD figure includes the part number, the configuration part numbers and attribute data. The attribute data indicate properties of the part and the configuration parts included in the part data.

(c1) step modifies the parts list based on the part number, the configuration part numbers and the attribute data from a modified CAD figure, and the design reference data.

(d1) step modifies the CAD figure based on a modification command, and modifies the parts list based on the part number, the configuration part number and the attribute data extracted from the modified CAD figure. Here, the modification command indicates command for modifying design of the part and is inputted through a network when the parts list is disclosed on the network.

It the parts list generating method of the present invention, the (b1) step includes (b11) step.

(b11) step generates another CAD figure of another part, based on the design reference data. Here, the another CAD figure includes another part number of the another part, other configuration part numbers and other attribute data. The other configuration part numbers are part numbers of other configuration parts of the another part. The other attribute data indicate properties of the another part and the other configuration parts.

The (c1) step includes (c11) step.

(c11) step extracts the another part number, the other configuration part numbers and the other attribute data from the another CAD figure, and modifyies the parts list based on the design reference data, the another part number, the another configuration part numbers and the other attribute data extracted from the another CAD figure.

The (d1) step includes (d11) step.

(d11) step modifies another CAD figure based on another modification command, and modifies parts list based on the another part number, the other configuration part numbers and the other attribute data extracted from the modified another CAD figure. Here, the other modification command indicates a command for modifying design of the another part and is inputted through a network when the parts list is disclosed on the network.

The parts list generating method of the present invention further includes the steps of (e1) and (f1).

(e1) step generates layout data which indicates a layout of the part in the apparatus, based on the part number, the part data and layout need data. Here, the layout need data relates the part number, the part data, and position and range of the part arranged in the apparatus.

(f1) step modifies the parts list, based on the layout data.

The parts list generating method of the present invention further includes the steps of (g1) and (h1).

(g1) step analyzes the part arranged in the apparatus by using the analysis method, based on the parts list, and the layout data.

(h1) step modifies the CAD figure, based on the analysis result.

The parts list generating method of the present invention further includes the steps of (i1) and (j1).

(i1) step estimates manufacture cost which is cost for manufacturing the part, based on the part data and cost data. Here, cost data relates the part data and costs related to manufacturing the part (j1) step modifies the CAD figure based on the manufacture cost.

The parts list generating method of the present invention further includes the steps of (k1) to (m1).

(k1) step generates an entire layout data indicating a layout of all parts in the apparatus, based on the parts list and the layout data of all the parts.

(l1) step modifies the CAD figure of a certain part of all the parts, based on the entire layout data, and extracts the part number, the configuration part numbers and the attribute data regarding the certain part from the modified CAD figure. Here, the certain part should be a changed design, based on the entire layout data.

(m1) step modifies the parts list, based on the part number, the configuration part numbers and the attribute data extracted from the modified CAD figure.

The parts list generating method of the present invention further includes the steps of (n1) to (p1)

(n1) step inspects the part numbers in the parts list, based on a rule for preparing the part number.

(o1) step generates an output figure interface based on a plurality of packages. Here, the output figure interface is made by reconfiguring the parts list. The plurality of packages are groups including a plurality of the parts and are generated by dividing all the parts into the groups.

(p1) step outputs CAD figures for each package, based on the output figure interface, and inspecting the CAD figures.

In order to achieve still another aspect of the present invention, the present invention provides a computer-readable medium having a computer program saved thereupon. The computer program includes the operation of (a2) to (d2).

(a2) operation generates a parts list of an apparatus, based on design reference data. Here, the parts list relates a part number, configuration part numbers and part data. The part is included in the apparatus. The configuration part numbers are part numbers of configuration parts of the part. The part data indicate properties of the part and the configuration parts. The design reference data are references for designing the apparatus.

(b2) operation generates a CAD figure of the part, based on the design reference data and the part number, and extracts the part number, the configuration part numbers and the attribute data from the CAD figure. Here, the CAD figure includes the part number, the configuration part numbers and attribute data. The attribute data indicate properties of the part and the configuration parts included in the part data.

(c2) operation modifies the parts list based on the part number, the configuration part numbers and the attribute data from modified CAD figure, and the design reference data.

(d2) operation modifies the CAD figure based on a modification command, and modifies the parts list based on the part number, the configuration part number and the attribute data extracted from the modified CAD figure. Here, the modification command indicates a command for modifying design of the part and is inputted through a network when the parts list is disclosed on the network.

In the computer-readable medium of the present invention, the computer program may further include the operations (e2) and (f2).

(e2) operation generates layout data which indicates a layout of the part in the apparatus, based on the part number, the part data and layout need data. Here, the layout need data relates the part number, the part data, and position and range of the part arranged in the apparatus.

(f2) operation modifies the parts list, based on the layout data.

In computer-readable medium of the present invention, the computer program may further include the operation (g2) and (h2).

(g2) operation analyzes the part arranged in the apparatus by using the analysis method, based on the parts list, and the layout data.

(h2) operation modifies the CAD figure, based on the analysis result.

In the computer-readable medium of the present invention, the computer program may further include the operation (i2) and (j2).

(i2) operation estimates manufacture cost which is cost for manufacturing the part, based on the part data and cost data. Here, cost data relates the part data and costs related to manufacturing the part.

(j2) operation modifies the CAD figure based on the manufacture cost.

In the computer-readable medium of the present invention, the computer program may further include the operation (k2) to (m2).

(k2) operation generates an entire layout data indicating a layout of all parts in the apparatus, based on the parts list and the layout data of all the parts.

(l2) operation modifies the CAD figure of a certain part of all the parts, based on the entire layout data, and extracts the part number, the configuration part numbers and the attribute data regarding the certain part from the modified CAD figure. Here, the certain part should be a changed design, based on the entire layout data.

(m2) operation modifies the parts list, based on the part number, the configuration part numbers and the attribute data extracted from the modified CAD figure.

In the computer-readable medium of the present invention, the computer program may further include the operation (n2) to (p2).

(n2) operation inspects the part numbers in the parts list, based on a rule for preparing the part number.

(o2) operation generates an output figure interface based on a plurality of packages. Here, the output figure interface is made by reconfiguring the parts list. The plurality of packages are groups including a plurality of the parts and are generated by dividing the all parts into the groups.

(p2) operation outputs CAD figures for each package, based on the output figure interface, and inspecting the CAD figures.

BRIEF DESCRIPTION OF THE DRAWINGS

FIG. 4 is a view illustrating the parts list;

FIG. 5 is a view describing a view describing a state judgment list;

FIG. 6 is a view describing an example of a display screen of a layout UI;

FIG. 8A is a view showing an equipment specification list;

FIG. 8B is a view showing a product variation list;

FIG. 11 is a view showing a display example of a CAD figure on a display screen;

DESCRIPTION OF THE PREFERRED EMBODIMENTS

An embodiment of a parts list apparatus of the present invention will be described below with reference to the attached drawings.

This embodiment is described by exemplifying a parts list used for designing an automobile. However, this may also be applied to even designing other apparatus provided with a number of parts.

Here, the parts list is the list generated, and used by an electronic method/an electronic apparatus like a computer. Each number of a part (hereafter, referred to as part number and PN) individually assigned to each part used for an automobile. The data in the parts list are the part number and the rest of the data (hereafter, referred to as part data). The part data related to each part is related to the part number of the part.

The parts represented by the part numbers are divided into a plurality of groups for a plurality of items that constitutes the automobile. In each item, the parts are classified into a plurality of hierarchies, and arranged in a tree structure. For example, a part (a part number) of a first hierarchy is related to a relational tree of the first hierarchy. Also, a part of a second hierarchy constituting the part of the first hierarchy is related to a relational tree of the second hierarchy that is a lower order of the first hierarchy. Hereafter, they are similarly related.

Figure 1:
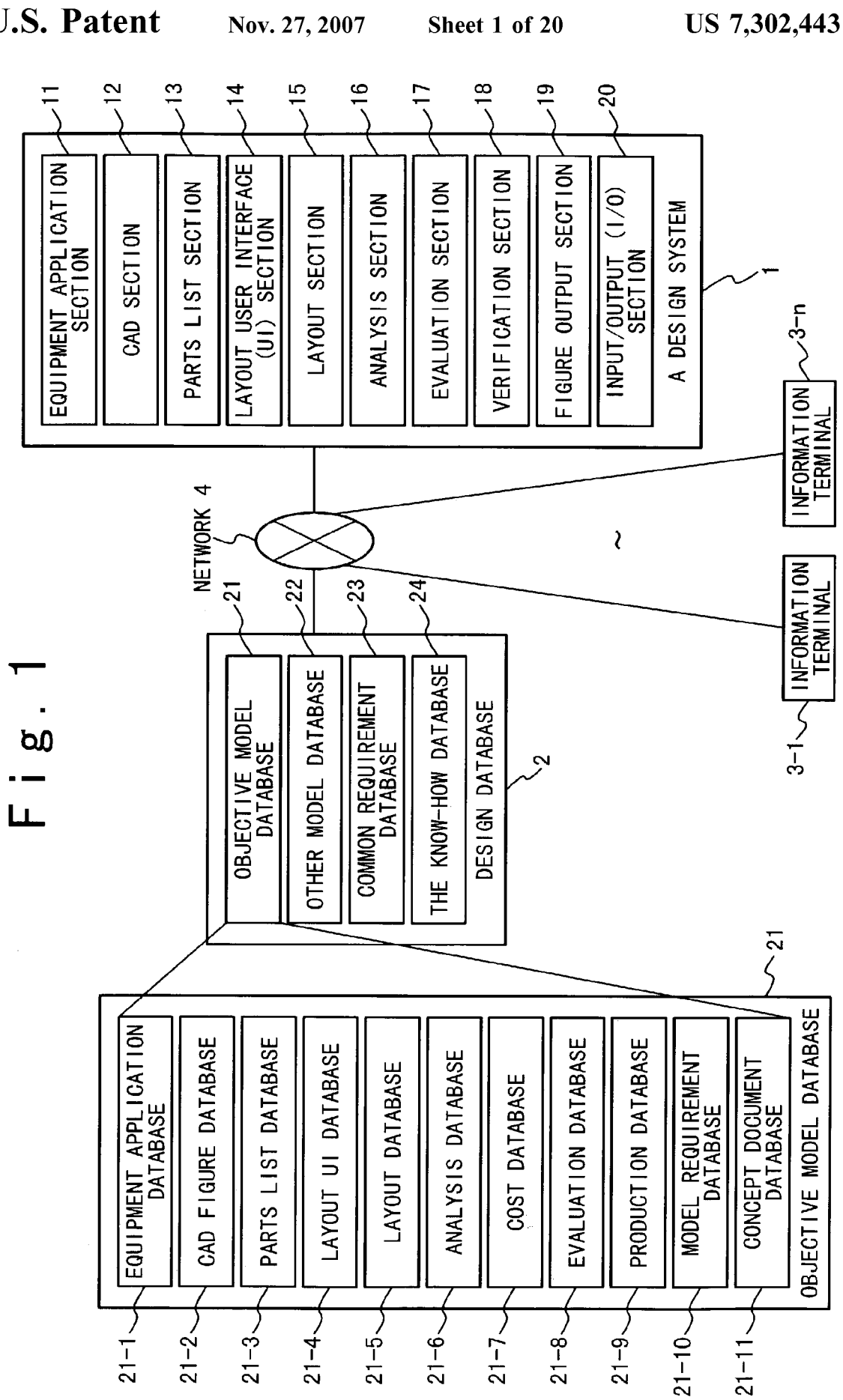
FIG. 1 is a view showing a configuration in an embodiment of a parts list system of the present invention.

FIG. 1 is a view showing the configuration in the embodiment of the parts list apparatus of the present invention.

The parts list apparatus includes a design system 1 and a design database 2. They are connected each other in two-way communication through a network 4. The information terminals 3-1 to 3-n (n=1, 2, . . . ) can access the parts list apparatus through the network 4 and can use it.

The design system 1 is a data processor exemplified as a workstation and a personal computer. It is connected to the network 4, and it can communicate with the design database 2 and the information terminals 3-1 to 3-n in the two-way communication. It includes an equipment application section 11, a CAD section 12, a parts list section 13, a layout user interface (UI) section 14, a layout section 15, an analysis section 16, an evaluation section 17, a verification section 18, a figure output section 19 and input/output (I/O) section 20. These sections are effected as a computer program and stored in the recording media (not shown) in the design system 1.

The design database 2 includes data groups stored in a memory apparatus. It is exemplified as a personal computer with a hard discs (recording media) and database software for its operation. The design database 2 is provided with the objective model database 21, the other model database 22, the common requirement database 23 and the know-how database 24. The design parts list database 2 may be included in the design system 1, so that the system becomes more compact than before.

The objective model database 21 includes the data, the standard requirement, the condition and the like regarding the objective model. The objective model database 21 includes the equipment application database 21-1, the CAD figure database 21-2, the parts list database 21-3, the layout UI database 21-4, the layout database 21-5, the analysis database 21-6, the cost database 21-7, the evaluation database 21-8, a production database 21-9, the model requirement database 21-10 and a concept document database 21-11.

The information terminals 3-1 to 3-n (n=1, 2, . . . ) are exemplified as personal computers, and they are the data processing terminals that can access the design system 1 and the design database 2. They are used by designers, engineers, persons in charge of a research, persons in charge of a technical evaluation, other designers, persons in charge of a purchase, persons in charge of PL (Product Line), persons in charge of a trial department, persons in charge of a test and the like.

The network 4 is a dedicated line exemplified as LAN (Local Area Network) or a communicable line, such as a public line and the like, exemplified as the Internet.

Next, the design system 1 is described in detail.

The equipment application section 11 generates an equipment specification list, a product variation list, a part property list, an equipment parts list and their related data. It generates them, based on the kinds of product and the specifications which are stored in databases and computer programs, or inputted by designers and persons related to parts design (hereafter, referred to as a designer).

Here, the equipment specification list relates the product to the equipment related to the specification. The product variation list relates the equipment to the product variation, based on the combination of the equipment. The part property list relates the specification-specified equipment, the specification-specified equipment variation and the part number (hereafter, also referred to as PN). The specification-specified equipment is the equipment which determines the difference between the specifications of the automobiles. The specification-specified equipment includes the parts which determine the difference among the specification of one equipment and those of others. The specification-specified equipment variation is the combination or the variation of the specification-specified equipment. The equipment parts list relates the part and the part variation. Those lists are stored in an equipment application database 21-1. Their details will be described later with reference to FIGS. 8A to 9C.

The CAD section 12 generates, manages and inspects the CAD (Computer Aided Design) data as the CAD figure of the part. It is stored in a CAD figure database 21-2. The CAD data of the part is firstly generated based on the input of the designer for each part number.

Here, the CAD data includes a part number, a CAD figure data, a title column data and a configuration part column data. The part number is a part number of a part to be drawn. The CAD figure data indicates three-dimensional figures of the part. The title column data indicates a title column of the CAD figure. The configuration part column data indicates a configuration part column of the CAD figure.

The CAD section 12 extracts the attribute data from the CAD data, based on searching a particular element data in the CAD data. Then, it transfers the attribute data to the parts list and the layout UI as the part configuration data. The CAD data is related to the part number of the parts list and the layout UI.

Also, the CAD section 12 automatically changes (replaces) the title column data and the configuration part column data of the CAD data, based on the attribute data included in the part configuration data which is fed back from the parts list and the layout UI.

Here, the attribute data indicates the attribute and properties of the part, which is included in both the parts list and the CAD data in common. The particular element data is the data generated by using a particular element. The particular element is a particular kind of a character/symbol such as some kinds of font. The part configuration data indicates the properties peculiar to a part, such as a part number, a part name, a number of parts, a material quality, a weight, a volume, a cost, a part analyzing method, a desirable parts manufacturer and the like. The layout UI will be described later.

The parts list section 13 generates, manages and inspects the parts list including the parts data, based on the attribute data from CAD data and the input of the designer. The designer refers to a development data, a standard requirement data, a know-how data, a other model data and a parts application data (those data are also referred to as design reference data). The parts list is stored in a parts list database 21-3.

Here, the development data indicates the information of the development of an objective model such as the design data, the number of automobiles to be manufactured and diversion parts. It is stored in a model requirement database 21-10. The standard requirement data indicates the requirements to be commonly required in all models, and it is stored in a common requirement database 23. The know-how data indicates the know-how in the model design, and it is stored in a know-how database 24. The other model data indicates the design of other models, and it is stored in another model database 22. The parts application data (included in the equipment specification list and the product variation list) indicates which a part is used in the combination of equipments (options), and it is stored in the equipment application database 21-1.

Also, the objective model is the automobile developed at this time, and the other model(s) is the already-developed automobile(s). Then, all of the models are the automobiles including the objective model and the other model(s).

The layout UI section 14 generates and manages the layout UI, based on the parts data included in the parts list and layout need table stored in the layout UI database 21-4. Also, it modifies (changes) and manages the layout UI, based on the layout data fed back from the layout section 15, after the generation of the layout (layout data) in the automobile. The layout UI is stored in a layout UI database 21-4.

Here, the layout need table includes the relation among the portion of the part number, the kind of the part and the normal mount position (including its range) in the automobile.

Figure 20:
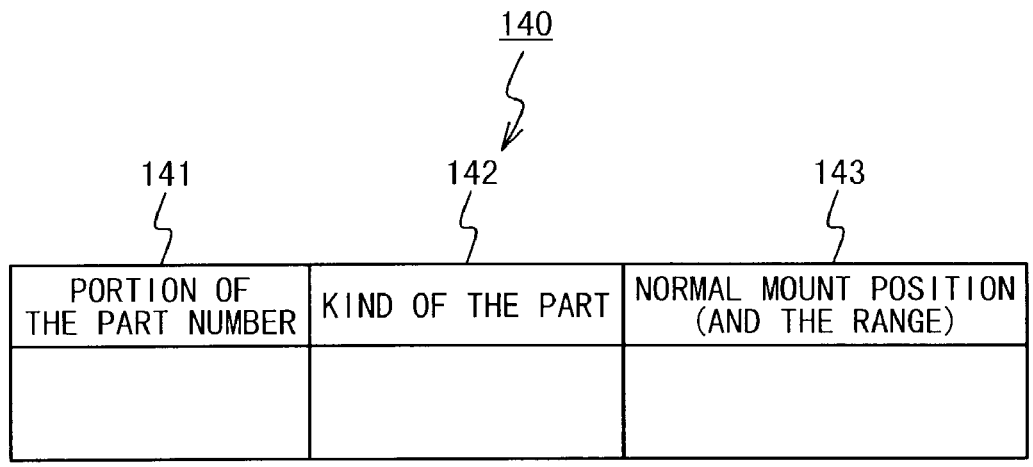
FIG. 20 is a view showing the layout need table.

FIG. 20 shows the layout need table. The layout need table 140 relates the portion of the part number 141, the kind of the part 142 and the normal mount position 143. The part number has the portion which indicates the kind of the part.

The layout data includes the layout element position shape data and the part setting data. The layout element position shape data (also, referred to as 3D data of layout element) indicates positions and shapes of layout elements. The layout elements are the elements necessary for doing layout of parts, and includes tools, standard planes, settings and the like. The part setting data indicates the set position of the part.

Here, the layout UI is the user interface to do the layout of a plurality of the parts in the automobile. It is the list including a layout range data of the part, a layout element configuration data, the part configuration data, a PN position shape link data, correspondingly to the part number. The parts (the part numbers) are classified into the hierarchies that are similar to the parts list. The layout range data indicates a range of a region wherein a part is arranged in the automobile. It is obtained from the layout need table. The layout element configuration data indicates the configuration of the layout elements. It is obtained from the layout data. The PN position shape link data indicates the relation between a part number in the layout UI and the part position shape data stored in the layout database 21-5. The part position shape data indicates the position wherein a part is mounted in the automobile and the part shape (also referred to as a 3D (three-dimensional) data), and it is obtained by the layout data.

The (part number) of the layout UI is related to the (part number) of the parts list and the layout data.

The layout section 15 generates and manages the layout data indicating the arrangement of the items and parts in the automobile, which is finally determined by the designer. At first, it is carried out automatically, based on the parts list and the layout UI. Then, it is also carried out with the support of the designer, based on the development data, the standard requirement data, the know-how data, the other model data, and the opinion data from the databases.

The layout data is stored in a layout database 21-5.

The layout data includes the layout element configuration data, the data of the positions and the shapes of the layout elements, the part setting data, the inter parts data, the inter part layout element data, a part layout element dynamic data and the part position shape data (3D data).

As for the layout element position shape data and the part position shape data of the objective model, those of the similar other model may be used for layout.

The layout data relates the parts list and the layout UI by the part number. The part position shape data is written to the parts list and the layout UI. The layout element configuration data is written to the layout UI.

Here, the opinion data summarizes the opinions with regard to the ideas for the parts list from the predetermined persons. It is exemplified as a countermeasures request document, an assembly process concept document, a technical problem indication document and a manufacturer candidate list.

Here, the inter parts data is the data indicating the positional relation and the connection relation between the parts. The inter part layout element data is the data indicating the positional relation and the connection relation between the part and the layout element. The part layout element dynamic data is the data indicating the positional relation and the connection relation to the layout element when the part is moved.

The analysis section 16 carries out analyses for each part configuration, based on the part configuration data and the part position shape data from the parts list or the layout UI or layout data. Then, it outputs the analyzed data. The analyses are exemplified by thermal, structural and dynamic analysis such as a CAE (computer-aided engineering) analysis. The analysis section 16 has a plurality of analyzing programs. Each part is corresponded to one or some programs, which is shown in the part configuration data of the parts list, and is analyzed by the programs. The analysis result is related to the parts list as the analysis data to which the consideration of the designer is added.

The analysis data is stored in an evaluation database 21-8.

The evaluation section 17 calculates a cost data for each part, item and equipment, based on the part configuration data from the parts list and the layout UI, the part position shape data, the development data, the process data and a cost table.

Here, the cost table includes the relation among the kinds of part, the data related to the part and the data related to the cost. The data related to the part includes kinds of material to be used for the part, kinds of process to manufacture the part and automobile, kind of apparatus to be used for manufacturing and the like. The data related to the cost includes the material cost/unit for each kind of material, the process cost/unit for each kind of process, the apparatus cost for each kind of apparatus, and the like.

Figure 21:
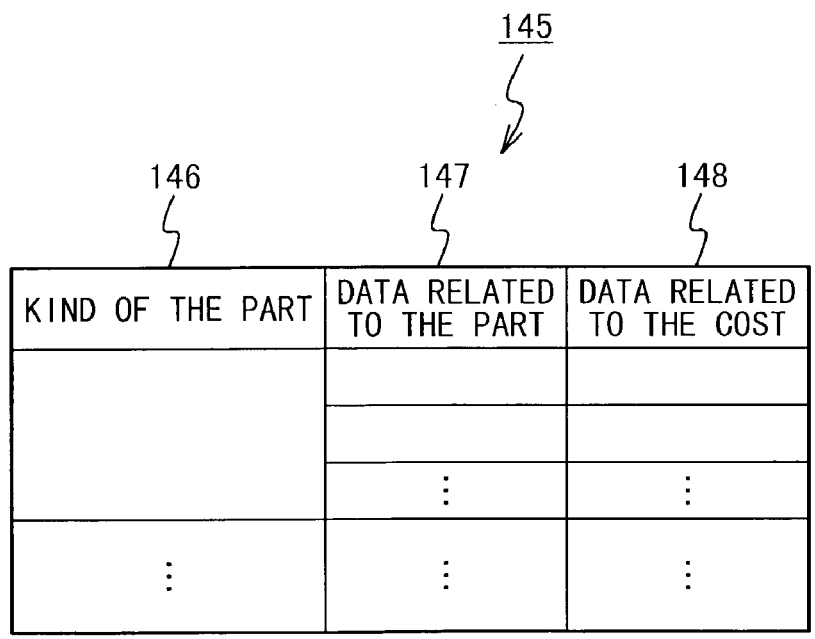
FIG. 21 is a view showing the cost table.

FIG. 21 shows the cost table. The cost table 145 relates the kinds of part 146, the data related to the part 147 and the data related to the cost 148.

Here, the cost data includes various costs such as a material cost, an assembly cost, a process cost, a mold cost, a depreciation cost, an investment cost, a part purchase cost and a managing cost. The process data shows the manufacturing processes specified by the designer.

Then, it generates a cost verification document in which the cost data is noted for each cost item. The cost verification document is related to each part, in the parts list.

Then, it compares the cost verification document with that of the similar part in the other model or the past cost verification document of the objective model. It judges whether or not the cost satisfies a preset requirement and generates a cost verification result. The preset requirement is exemplified as a cost reduction target value from the other model and the absolute amount of the cost.

The cost verification document, the cost verification result, the cost table and the preset requirement are stored in a cost database 21-7.

The verification section 18 generates and manages the entire layout data that is the layout of the entire parts in the objective model. It is carried out, based on the data of the parts list and the layout UI of the objective model.

The designer (or the verification section 18) verifies whether or not the entire layout is appropriate. It is carried out based on the standard requirement data and the know-how data.

The entire layout and the entire layout verification result are stored in an evaluation database 21-8.

The figure output section 19 generates a plurality of figure output UIs by re-configuring the parts list for each package, based on the parts list and a specification report. Then, it outputs the CAD data (CAD figures) at every package, based on the data of this figure output UI.

Here, the figure output UI is the portion of the parts list. Each figure output UI includes the part data of each package. The package is the group of parts such as the item and the equipment and the like. For example, one figure output UI is composed of the data of one item (including a plurality of parts) extracted from the parts list. The specification report is the specification for each derivative model, which is generated, based on the equipment application data. The equipment application data is the equipment specification list and the product variation list stored in the equipment application database 21-1. The objective model includes a plurality of the derivative models which are derived from the objective model.

The designers inspect the outputted CAD figures. It is carried out based on the part number, the CAD data, the specification report, the part configuration data and the parts application data, for each package. If the figures are permitted by the figure inspection, then, the figures, the parts list, the layout UI and the layout data are formally registered.

Here, in the parts list, the part numbers, the items, or file names are related to the concept data, the opinion data, the layout UI, the layout data, the analysis data, a cost verification document and the CAD data of the parts.

Here, the concept data is the concept document summarizing the concepts of the designer, and it is exemplified as a concept chart, an FTA (fault tree analysis)/FMEA (failure mode effect analysis) sheet, a proposal specification and a statement document.

The above-mentioned respective sections need not be located within one designing system, and they may be dispersed and located in a plurality of systems connected to the network 4. In this case, it is possible to reduce the burden on each system and thereby improve an operation speed.

Next, The design database 2 is described in detail.

In the objective model database 21, the equipment application database 21-1 stores the equipment application data (the equipment specification list and the product variation list) that relates each variation of the derivative model (grade) to each equipment application. Also, it stores the parts application data (the part property list and the equipment parts list). These data (lists) are further explained later at FIGS. 8 to 9.

The CAD figure database 21-2 stores the CAD data and a region table. The region table indicates the relation between data in the CAD figure and the their coordinates in the CAD figure. Here, the data in the CAD figure include a title column region, a configuration part column region and the attribute data. Their coordinates in the CAD figure indicates their positions to be formed in the CAD figure on a display screen.

Figure 19:
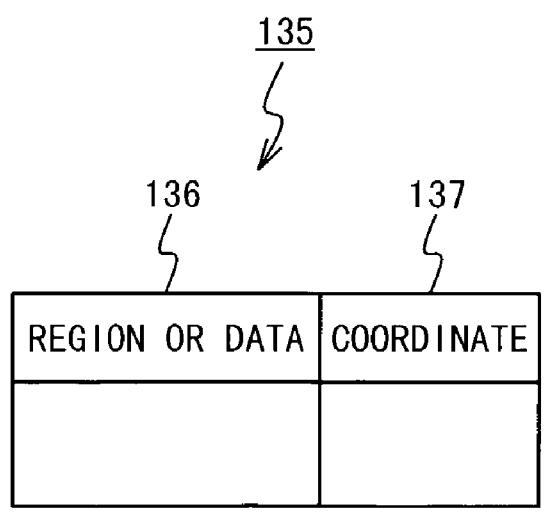
FIG. 19 is a view showing the region table.

Here, FIG. 19 shows the region table. In FIG. 19, each region or data 136 in the CAD figure and each coordinate 137 in the CAD figure are related.

Also, they store the standard requirement of figures (not shown).

The parts list database 21-3 stores the parts list, and a state judgment list.

Here, the state judgement list shows that relation between the state data and the state indicative data. The state shows the stage of the part data such as concept stage, the designing stage and the figure output stage. The parts list is further explained later at FIGS. 2 to 4. The state judgement list is further explained later at FIG. 5.

Also, the parts list database 21-3 stores an attribution corresponding table that relates each attribute data of the CAD data and each attribute data of the parts list.

Figure 18:
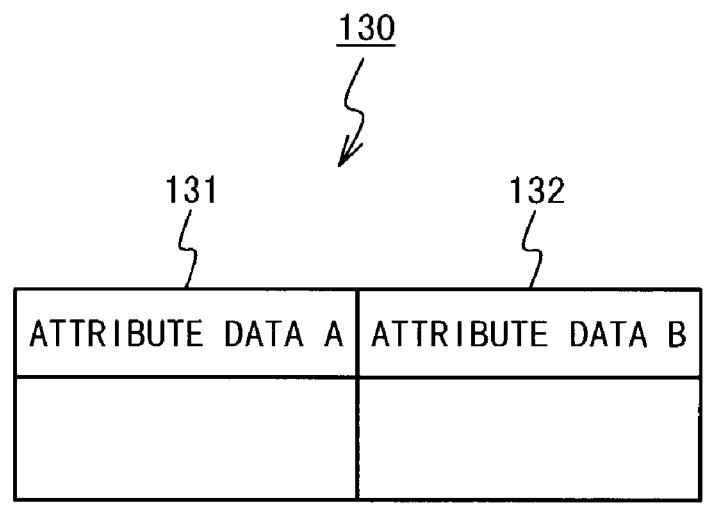
FIG. 18 is a view showing the attribution corresponding table.

Here, FIG. 18 shows the attribution corresponding table. In FIG. 18, each attribute data A 131 of the CAD data 119 and each attribute data B 132 of the parts list 21-3' are related. It is stored in the parts list database 21-3.

The layout UI database 21-4 stores the layout UI and the layout need table. The layout UI is further explained later at FIG. 6.

The layout database 21-5 stores the layout data. The layout data is further explained later at FIG. 7.

The analysis database 21-6 stores the analysis data. Also, it stores the part and the method of analyzing the part, which are related each other. Moreover, it stores the thermal, structural and dynamic requirements which the part should satisfy.

The cost database 21-7 stores the cost verification document and a cost verification result. Also, it stores the preset requirement (standard) to evaluate a cost of a part. Moreover, it stores the cost table that relates a kind of a part, a step of manufacturing the same, and that cost.

The evaluation database 21-8 stores the data which relates a model, a layout data of entire objective models and a layout verification result of the entire objective models.

The production database 21-9 stores the data which relates a part number/a model and data related to a production of the part/the model. The data related to the production includes an automobile allocation plan, a producing plan, a manufacturer name, an allocation plan, a delivery plan, a test report, a countermeasures idea and the like.

The model requirement database 21-10 stores the development data of an objective model. The development data of the objective model includes a concept, a design sketch, a schedule, a number of automobiles to manufacture, a planned production SS/line, a target cost, a weight, a concept figure of other parts and a calculation figure of other parts.

The concept document database 21-11 stores the concept data that is the result of the objective model considered by the designer including the memo data. The memo data is the memo written by the designer.

The other model database 22 stores the other model data. The other model data includes a concept data, the CAD data, a layout data, a specification report, a parts list, a layout UI, an analysis data, a layout/cost verification result, a test result, a proposal specification, a weight, an investment and a number of automobiles to manufacture.

The common requirement database 23 stores the data with regard to the common requirement to be achieved for all models of an automobile to be developed. The common requirement includes a law, an A-rank requirement, TALK, various checklists, a design manual, Q10, KSI, a model layout and a requirement of productivity.

The know-how database 24 stores various know-how with regard to the automobile design. The know-how includes a set of application examples, a procedure setting method, a calculating method, an analyzing method, a technical report, a technical dictionary and a tool peculiar to an organization.

The above-mentioned databases need not be included in one design database 2. It may be dispersed to a plurality of groups, each of which includes some databases and is connected to the network. In this case, the burden on the database is reduced.

Also, the design database 2 may be included in the design system 1. In this case, the speed at which a data is transmitted or received is improved.

Figure 2:
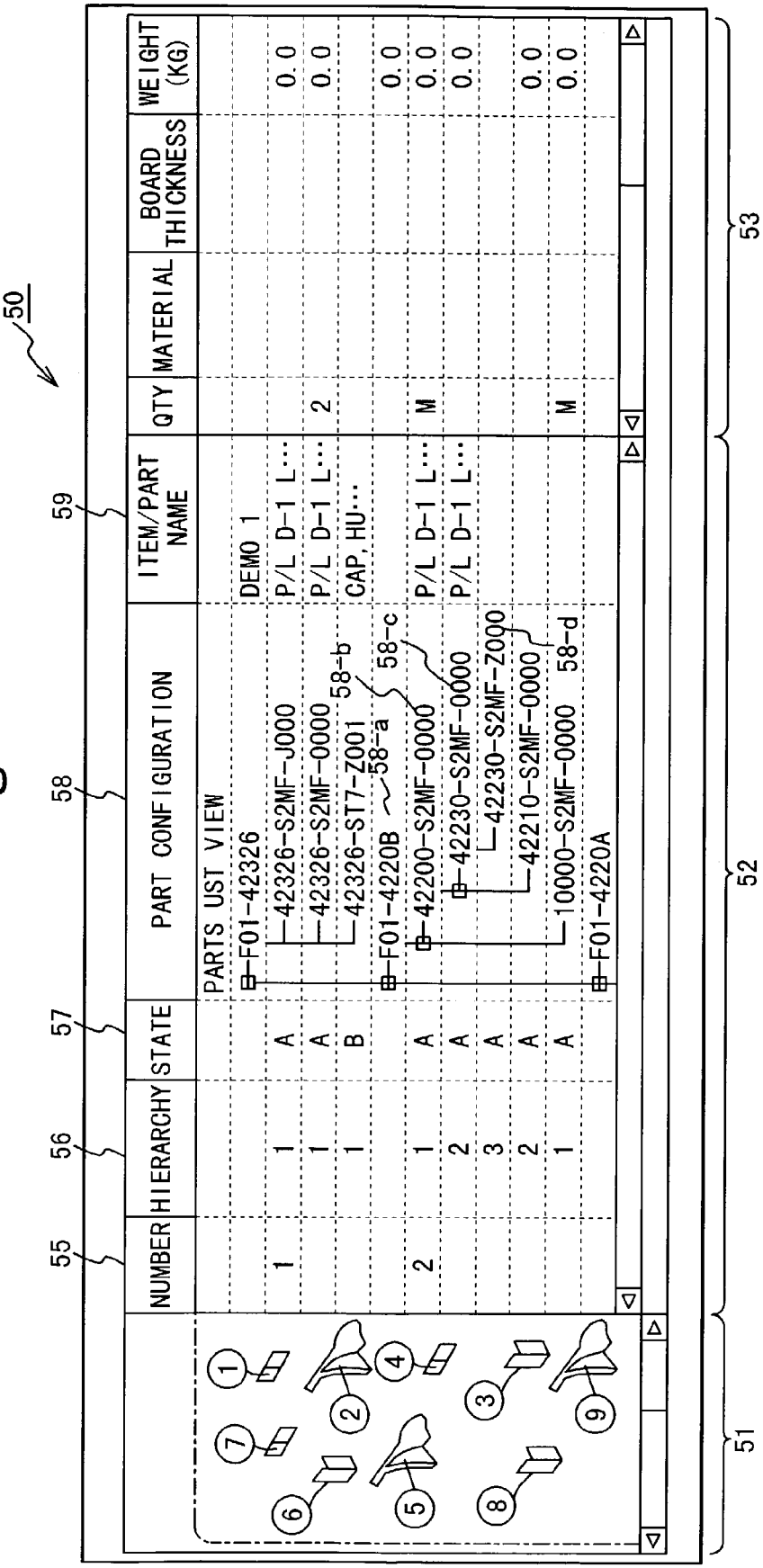
FIG. 2 is a view showing an example of a display screen of a parts list.

Next, the parts list will be explained below in detail with reference to FIG. 2. FIG. 2 is a view showing an example of a display screen displaying the parts list. A display screen 50 includes: a picture data display section 51; a part number display section 52 having a number 55, a hierarchy 56, a state 57, a part configuration 58 and an item/part name 59; and a configuration data display section 53. The part data specified by one part number is placed in one column of the display screen 50.

The picture data display section 51 displays a picture data stored in or attached or related to the parts list such as CAD figures, a document read by a scanner.

The part number display section 52 displays the data to identify a part. The number 55 indicates a symbol, based on a predetermined rule. The hierarchy 56 indicates the number showing the above-mentioned hierarchy. The state 57 indicates the state of the part such as the concept stage and designing stage. The part configuration 58 indicates an item and a part number of each hierarchy represented in a form of a relational tree structure, respectively. The item/part name 59 indicates names or class name or the like.

The configuration data display section 53 displays the parts application data, the part configuration data, the PN position shape link data of the part, the link to the other data and the like, for each part (each column)

The part configuration 58 has the relational tree structure as mentioned above. For example, in FIG. 2, below an item 58-$a$ (F01 4220B), a part number 58-$b$ of a first hierarchy, a part number 58-$c$ of a second hierarchy and a part number 58-$d$ of a third hierarchy are represented in the relational tree structure. The hierarchy of each part number is represented in the hierarchy 56.

The data structure of the parts list will be described below with reference to FIG. 3.

Figure 3:
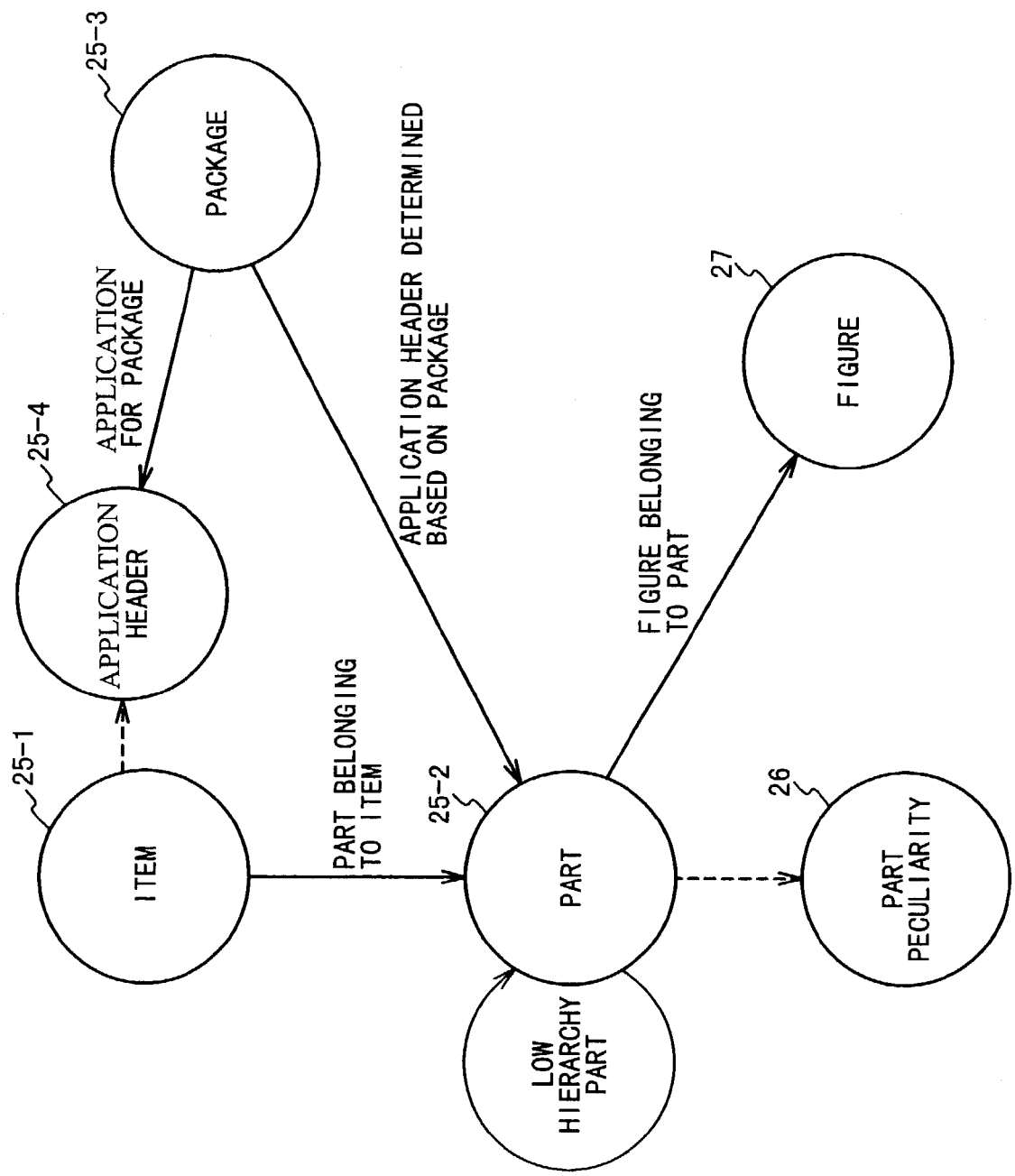
FIG. 3 is a view describing a data structure of a parts list.

FIG. 3 is a view describing the data structure of the parts list. The data of the parts list is composed of the data having respective attributes of an item 25-1, a part 25-2, a package 25-3, an application header 254, a part peculiarity 26 and a FIG. 27. Each data have relations with other data such as that shown by arrows in FIG. 3.

The item 25-1 includes an item state data and an item data in which a part is included. The item state data indicates a state of an item such as a stage whether its data change or not. The item data corresponds to the item number of the part configuration 58 and the item name of the item/part name 59 in FIG. 2.

The part 25-2 includes a part number, a part state data, a figure flag, and a figure state data. The part state data indicates a state of a part such as a stage whether its data may be changed or not. The figure flag indicates a presence or absence of a CAD figure. The figure state data indicates a stage whether the figure is admitted or not. The part number data corresponds to the part number of the part configuration 58 and the part number name of the item/part name 59 in FIG. 2.

The package 25-3 includes the items and the part numbers composing a package (constituting a group of a set of figures to be collectively inspected), a package state data, and a total flag. The package state data indicates a state of the package such as a stage whether its data may be changed or not. The total flag indicates a validation of the data of the item and the part number. The items and the part numbers of the package corresponds to the CAD data in the CAD figure database 21-2 through the configuration data display section 53 in FIG. 2.

The application header 25-4 includes a derivative data showing a derivative model to which a part indicated by a part number is applied. The derivative data corresponds to the derivative model in the equipment application database 21-1 through the configuration data display section 53 in FIG. 2.

The part peculiarity 26 includes an data peculiar to a part which is related to the part number, such as a part configuration data and the like. The data corresponds to the configuration data display section 53 in FIG. 2.

The FIG. 27 includes an data of a figure of a part which is related to a part number and indicated by the part number.

The data corresponds to the CAD data in the CAD figure database 21-2 through the configuration data display section 53 in FIG. 2.

The combination of the item state data, the part state data, the figure flag, the figure state data, the package state data, and a total check flag corresponds to the state 57.

The part 25-2, including the low hierarchy parts, has a relation to the item 25-1, such that the part 25-2 belongs to item 25-1. The part 25-2 has a relation to the part peculiarity 26 if the part has peculiar data. The part 25-2 also has a relation to the FIG. 27, such that the CAD figure (27) belongs to the part 25-2. The package 25-3 has a relation to the part 25-2, such that the part 25-2 is applied to the package 25-3. The package 25-3 also has a relation to the application header 25-4, such that the application header 25-4 is determined based on the package 25-3.

These data structures are exemplified by the data generated by using object-oriented program and the relational database system. These data in the parts list 21-3' are not necessary in the one table (list). For example, tables, each of which includes some of the data of the parts list 21-3', have relations each other. Each table is related by the part number as a key, like the relational database system. In this case, the parts list 21-3' is the aggregation of all the tables.

The parts list, explained with reference to FIGS. 2 to 3 and stored in the parts list database 21-3, will be described below in detail. The parts list database 21-3 stores the parts list 21-3' (the data) shown in FIG. 4.

FIG. 4 is a view illustrating the parts list 21-3'. The parts list 21-3' has a hierarchy 28, a state 29, an item 30, a part number 32, a status A31, a status B33, a figure flag 34, a package 35, a status C36, a total flag 37, an application header 38, a status D39, an application 40, a part configuration 41, a configuration number 42, a configuration part number 43 and a link 44.

The hierarchy 28 corresponds to the hierarchy 56 in FIG. 2.

The state 29 corresponds to the state 57 in FIG. 2.

The item 30 is the item data as mentioned above at FIG. 3.

The part number 32 is the part number data as mentioned above at FIG. 3.

The status A31 indicates the item state data as mentioned above at FIG. 3, and indicates states a1 to a4.

The status B33 indicates the part state data as mentioned above at FIG. 3, and indicates states b1 to b3.

The figure flag 34 indicates the figure flag as mentioned above at FIG. 3.

The package 35 indicates the package as mentioned above at FIG. 3.

The status C36 indicates the package state data as mentioned above at FIG. 3, and indicates states c1, c2.

The total flag 37 indicates the total flag as mentioned above at FIG. 3.

The application header 38 indicates a derivative data as mentioned above at FIG. 3.

The status D39 indicates the figure state data as mentioned above at FIG. 3, and indicates a state d1.

The application 40 is the parts application data.

The part configuration 41 is the part configuration data.

The configuration number 42 indicates a kind of a figure on which this part is drawn.

The configuration number 43 indicates a part number of a part (a sub-part) constituting this part (a main-part).

The link 44 is the data, such as the address, indicating link destinations with regard to other files, data, figures and the like.

Among the above-mentioned data, some of them are cited from the data of CAD figure as the attributed data included in the CAD data.

A state judgment list is also stored in the parts list database 21-3. The state judgment list is a table in which status A31 to status D39 as state indicative data, a figure flag, a total flag, and the state data are related.

Figure 5:
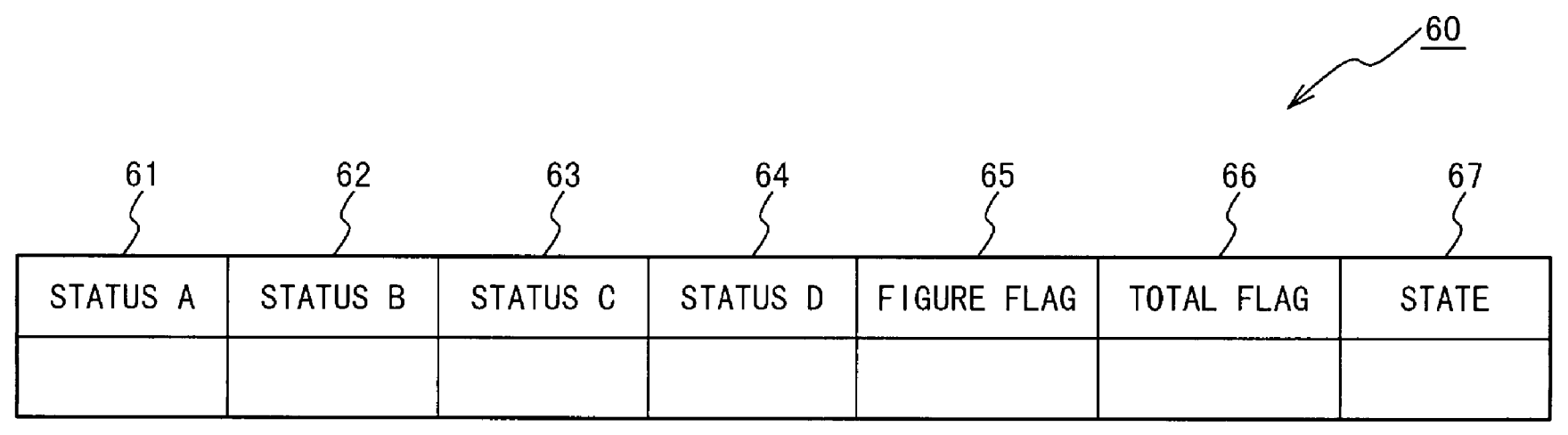

FIG. 5 is a view illustrating the state judgment list 60. The state judgment list 60 has respective data of a status A61, a status B62, a status C63, a status D64, a figure flag 65, a total flag 66 and a state 67.

Each of the statuses A61 to D64 correspond to the status A31, the status B33, the status C36 and the status D39 of the parts list 21-3' of FIG. 4. Similarly, the figure flag 65 and the total flag 66 correspond to the figure flag 34 and the total flag 37 of FIG. 4, respectively.

The state 67 indicates the conditions (states) of the admission, the limitation and the inhibition with regard to the change of the data in FIG. 4. The state 67 is exemplified such as the states 1 to 4. In this case, the state 1 indicates that the operation to change the part number 32 and the application 40 is admitted. The state 2 indicates that the operation to delete the part number 32 is not admitted. The state 3 indicates that the operation to change the application 40 is not admitted. The state 4 indicates that the operation to change/add/delete the part number 32 is not admitted.

Then, the state 67 is determined for a certain combination of the status A61, the status B62, the status C63, the status D64, the figure flag 65 and the total flag 66, in FIG. 5. Based on the determination, the state 29 in FIG. 4 is determined and then reflected in the state 57 in FIG. 2.

That is, the state 57 (state data) in FIG. 2 is determined based on the combination of the four states and the two flags as mentioned above. Based on the combination, the state 57 is judged as each of the stages exemplified as a concept stage (the state 1 in FIG. 5), a designing stage (the state 2), a figure output stage a (the state 3) and a figure output stage b (the state 4).

In the present invention, with regard to the item and the part, a data indicating its state (the state 29 in FIG. 4) is added to the parts list for each item and part. By checking the state of the part, it is easy to know what state (stage) the part is in. Even if the same parts list is referred to, using the state 29 related to the part number enables the allowable (executable) operation at each stage to be controlled, for each part discriminated by the part number. That is, the parts of the various states can be mixed within the same parts list.

Also, the data peculiar to the part in the parts list can be operated without any dependence on the stages of the state 29 of the parts list, by providing the attribute of the part peculiarity 26.

The display of the parts list as shown in FIG. 2 is one embodiment, and the present invention is not limited to this display.

The person referring to the parts list can always obtain the data of the part indicated by the part number. Here, the data includes not only the data within the file of the parts list but also the data related (linked) to the file (or the item, the part number) of the parts list. It is carried out by finding out a proper part number from the part number 58 in FIG. 2 and looking at its row (highlighted in FIG. 2).

Also, in the parts list, between the concept stage and the manufacturing stage of the automobile, the modification and the change of the part are carried out in many cases. However, their data is written to the file related to the parts list and the parts list itself. That is, the modification and the change of the part are reflected in the file at real time on each occasion. Thus, the concerned person can always know the newest situation of the development.

The parts list may be generated for each classification or may be collectively generated for each model. Here, the classification implies a family (for example, a frame, an engine, a transmission and the like) a model (for example, a car model), a section (for example, a roof) and an item (for example, an airbag).

In this embodiment, "relation" of data includes the relation between files, the relation between data within a file and a different file, and, the relation between data within a file and data within a different file. Then, it is at a state that the one of data/file can be called out from the other data/file. For example, there is a relation method of storing a location of the other file/data (for example, a database name, a path to a database and an address of data within a database) in one file/data and then calling out by using it. Also, there is a relation method of storing a name of a database in which the different file/data is stored, as well as a file name/part number and then calling out by using it, and the like. However, it is not limited to them.

It is possible to use an approach of a conventional relational database to thereby carry out the relation based on various keys.

The layout UI will be described below in detail with reference to FIG. 6.

FIG. 6 is a view showing an example of a display screen of the layout UI. A display screen 68 has: a part number display section 69 containing a number 71, a part number 72, a layout name 73; and a layout relation data display section 70.

The part number display section 69 displays an data that specifies a part. For examples, the No. 71 describes a symbol, based on a predetermined rule, the part number 72 describes a part number, and the layout name 73 describes a layout name data, respectively. The layout relation data display section 70 displays a layout element configuration data of the part (which will be explained later), the part configuration data and the PN position shape link data, the link to the other data and the like, for each part.

The display of the layout UI as shown in FIG. 6 is one embodiment, and it is not limited to this display.

The person referring to the layout UI can always obtain the data of the part indicated by the part number. Here, the data includes not only the data within the file of the layout UI but also the data related (linked) to the file of the layout UI. It is carried out by finding out a proper part number from the part number 72 and then looking at its row (highlighted in FIG. 6).

Also, in the layout UI, between the concept stage and the manufacturing stage of the automobile, the modification and the change of the part are carried out in many cases. However, their data is written to the file related to the layout UI and the layout UI itself. That is, the modification and the change of the part are reflected in the file at real time on each occasion. Thus, the concerned person can always know the newest situation of the development.

Figure 7:
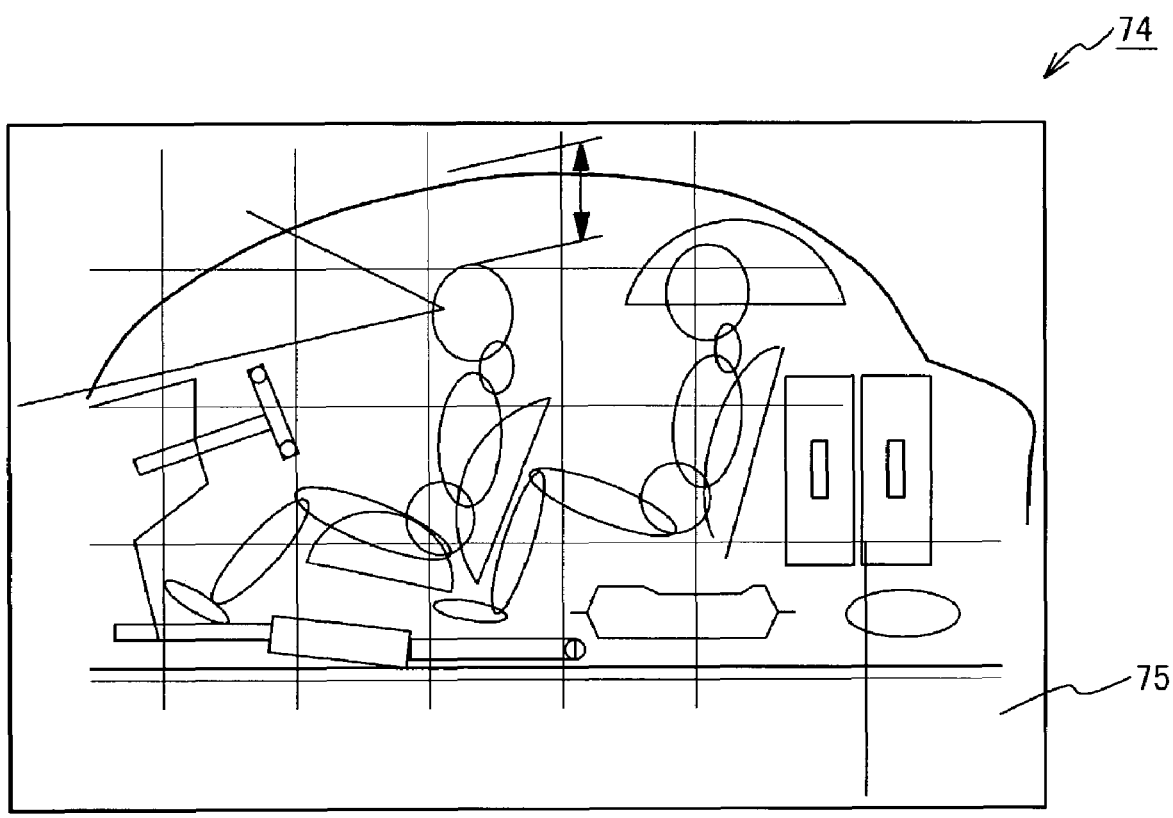
FIG. 7 is a view describing an example of a display screen of a layout data.

The layout will be described below in detail with reference to FIG. 7. FIG. 7 is a view showing an example of a display screen of the layout. A display screen 74 has a screen 75.

On the screen 75, the designer uses the data such as part configuration data and the like, from the parts list and the layout UI. Then, the designer considers the picture arrangement situation of the respective configuration parts. Then, the designer determines its arrangement, which results in the determination of the layout element position shape data, the part setting data and the like.

The layout shown in FIG. 7 is one embodiment, and it is not limited thereto.

In the layout, between the concept stage and the manufacturing stage of the automobile, the modification and the change of the part are carried out in many cases. However, their data is written to the file related to the layout and the layout itself. That is, the modification and the change of the part are reflected in the file at real time on each occasion. Thus, the concerned person can always know the newest situation of the development.

The equipment specification list will be explained below.

Figures 8A, 8B:
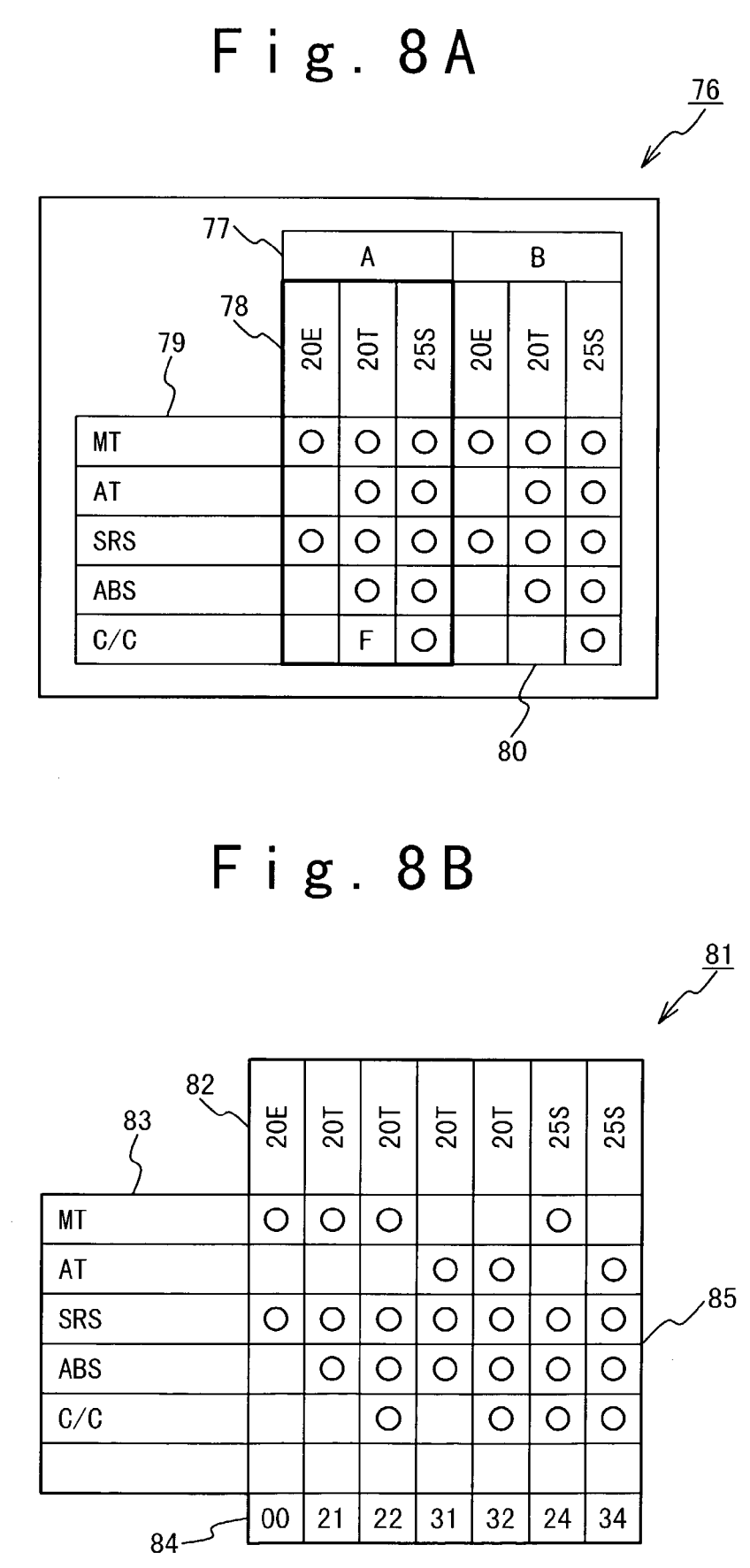

FIG. 8A is a view showing the equipment specification list.

An equipment specification list 76 includes a car model column 77, a type column 78, an equipment column 79 and a check column 80.

The car model column 77 indicates the car model as the objective model. Here, a car model A and a car model B are indicated.

The type column 78 indicates a type as a derivative model in each car model. Here, for example, three types of a type 20E, a type 20T and a type 25S are indicated for the car model A.

The equipment column 79 indicates the equipment. Here, it indicates MT (Manual Transmission), AT (Automatic Transmission), SRS (Sun Roof System), ABS (Anti Lock Brake System) and C/C (Cruise Control).

The check column 80 indicates the relation between the type and the equipment. For example, in the type 20E of the car model A, there are checks in the columns of MT and SRS among the equipment of FIG. 8A, which represent that MT and SRS are installed. Here, the existence of the check implies that a white circle, a black circle or "1" exists on figures. Incidentally, F indicates an option.

The product variation list will be explained below.

FIG. 8B is a view showing the product variation list.

The product variation list 81 includes a type column 82, an equipment column 83, a product variation code column 84 and a check column 85. Here, FIG. 8B indicates only the component corresponding to the car model A.

The type column 82 indicates a type as a derivative model in each car model corresponding to the product variation. It corresponds to the type column 78 in FIG. 8A. In the product variation list 81, the equipment specification list 76 is dispersed for each product variation. Thus, for example, the type 20T has four kinds in FIG. 8B.

The equipment column 83 indicates the equipment. This is equal to the equipment column 79 in FIG. 8A.

The product variation code column 84 indicates a code of the product variation. The designer does input so that different values are provided for all product variations, based on a proper rule.

The check column 85 indicates the relation between the type, the product variation code and the equipment. For example, the fact that this type 20T has the four kinds of the product variations can be calculated from the column of the type 20T of the car model A in FIG. 8A. They are noted as the four kinds of product variation codes 21, 22, 31 and 32 of the type 20T in FIG. 8B. It indicates that only the equipment having a white circle in the check column 85 is installed, among a plurality of equipment in FIG. 8A, in the respective kinds.

Figure 9A:
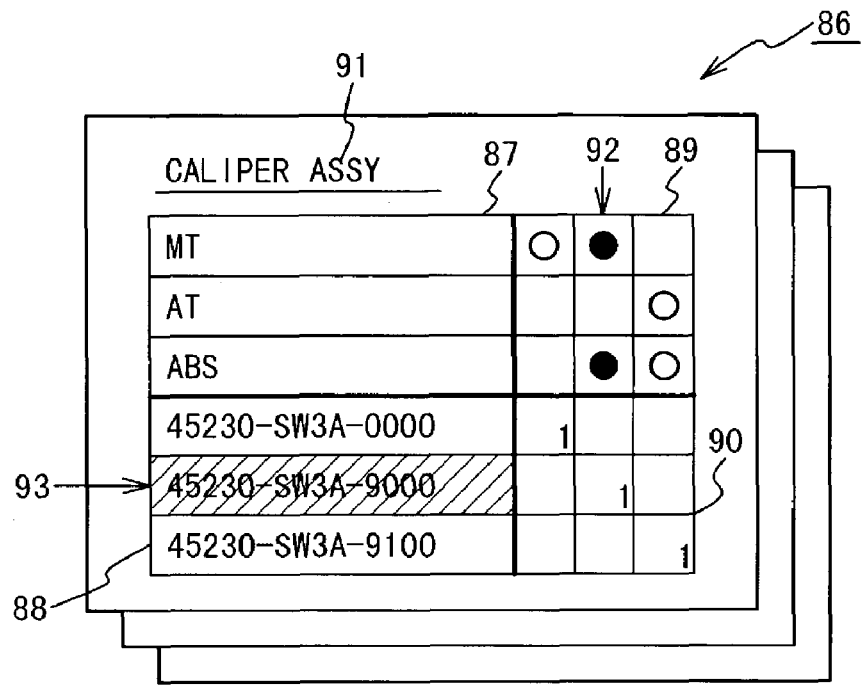
FIG. 9A is a view showing a part property list.

FIG. 9A is a view showing the part property list.

The part property list has an equipment column 87, a part number column 88, an equipment check column 89, a part number check column 90 and an item 91.

The equipment column 87 indicates the specification-specified equipment. The part number column 88 indicates the part number of the parts used for the equipment in the equipment column 87. The equipment check column 89 indicates the obtainable combination of the equipments of the equipment column 87, based on the specifications of the automobiles. The part number check column 90 indicates the relation between the combination of the equipments in the equipment check column 89 and the part number of the part number column 88. The item 91 indicates a name of an item to which the part in this part property list is applied.

The designer determines the equipment column 87, based on the equipment. The equipment is used in the item (item 91), for setting the specification difference. Based on it, the specification-specified equipment variation is calculated to thereby determine the equipment check column 89. The designer determines the parts (the part number 88), for the number of the variations (combinations). The part number check column 90 is determined, based on the combination of the equipments (the equipment check column 89) and the part number (part number 88).

Figure 9B:
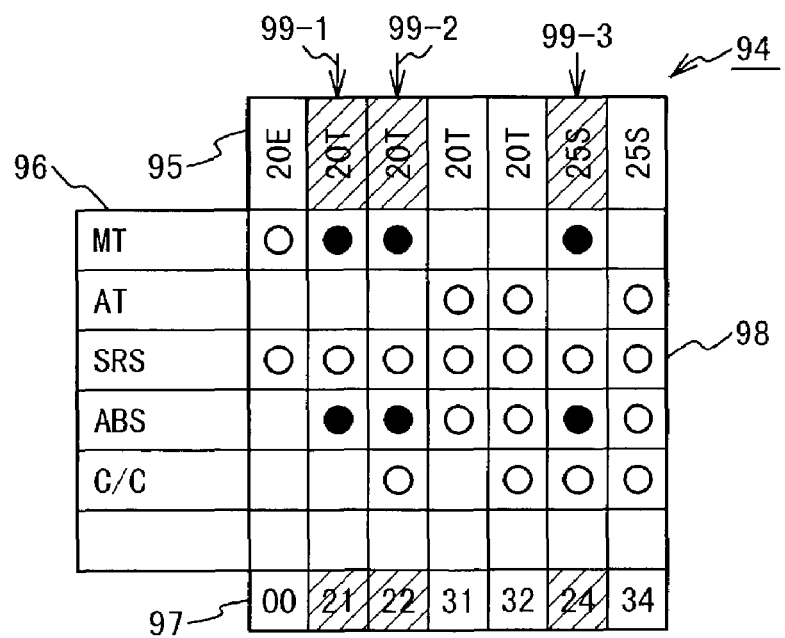
FIG. 9B is a view showing a product variation list to explain an extraction product variation.

FIG. 9B is a view showing a product variation list. The product variation list 94 in FIG. 9B is the same as the product variation list 81 in FIG. 8B The product variation list 94 includes a type column 95, an equipment column 96, a product variation code column 97 and a check column 98. They correspond to the type column 82, the equipment column 83, the product variation code column 84 and the check column 85, respectively.

The product variation list 94 is generated, based on the part property list.

With reference to FIG. 9A, when a column 92 of the equipment check column 89 is viewed as an example, there are checks in MT and ABS. The fact that it corresponds to a part number 45230-SW3A-90000 on a row 93 of the part number column 88 is known from the check of the part number check column 90.

In FIG. 9B, in the check column 98, the combinations of the product variation code column 97 and the type column 95 in which there are the checks in the row of the MT and the ABS are (20T, 21), (20T, 22) and (25S, 24). These combinations are indicated by column 99-1 to 99-3 of the type column 95. That is, in this case, (20T, 21), (20T, 22) and (25S, 24) are extracted as an extraction product variations in which the part identified by the part number 45230-SW3A-9000 corresponding to the equipments of the MT and the ABS is installed.

The equipment parts list will be described below.

Figure 9C:
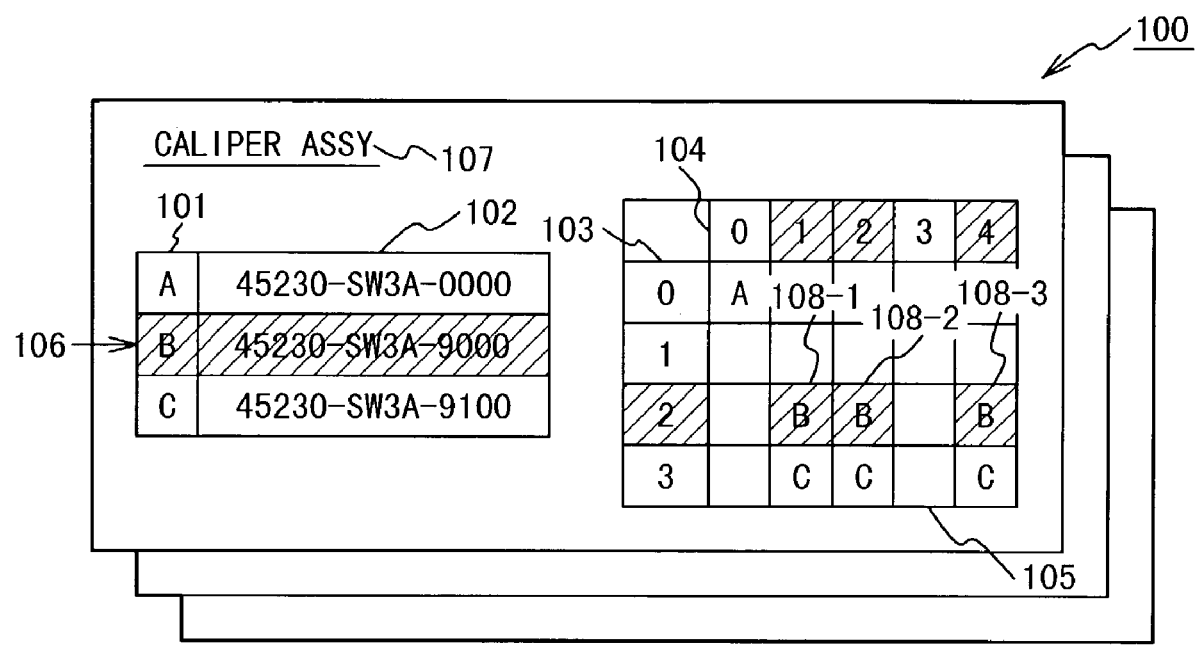
FIG. 9C is a view showing an equipment parts list.

FIG. 9C is a view showing the equipment parts list.

The equipment parts list 100 includes a part symbol column 101, a part number column 102, a product variation code A column 103, a product variation code B column 104, a part column 105 and an item 107.

The item 107 indicates a name of an item to which a part in this part property list is applied. The item 107 corresponds to the item 91 of FIG. 9A. Here, it shows the same item (CALIPER ASSY). The part symbol column 101 is a symbol indicating a part. The part number column 102 indicates a part number. The part number column 102 corresponds to the part number column 88 of FIG. 9A. The product variation code A column 103 is the numeral on one digit (here, on a left side of numerals of two digits) in the product variation code of the product variation code column 97 in FIG. 9B.

The product variation code B column 104 is the numeral on the other digit (the right side) in the product variation code of the product variation code column 97 in FIG. 9B. The part column 105 is a symbol of a part applied to an extraction equipment variation specified by the product variation code A column 103 and the product variation code B column 104. The symbol corresponds to that of the part symbol column 101.

In the above-mentioned example at FIG. 9B, as for the part used in the CALIPER ASSY of the item 107, (20T, 21), (20T, 22) and (25S, 24) are extracted as the extraction product variations. In these variations, the part number 45230-SW3A-9000 corresponding to the specification-specified equipment variation (MT and ABS) in FIG. 9B is equipped. In this case, the extraction product variation codes are 21, 22 and 24, respectively. Here, the extraction product variation codes 21, 22 and 24 are disassembled into (2, 1), (2, 2), and (2, 4), respectively. This is related to (the product variation code A column 103, the product variation code B column 104)=(2, 1), (2, 2), and (2, 4). Then, a part (B, 45230-SW3A-9000) on a row 106 corresponding to the extraction product variation code 21 is noted in a column 108-1 of (the product variation code A column 103, the product variation code B column 104)=(2, 1). In this way, the equipment parts list is generated. The equipment parts list indicates the relation between the extraction product variation codes (21, 22 and 24) specified by the product variation code A column 103 (0 to 3) and the product variation code B column 107 (0 to 4) and the part column 105 applied thereto. The other columns are similarly embedded.

In this way, the above-mentioned respective tables enable us to calculate the part application to the product variation code and the number of the parts.

FIGS. 8A to 9C illustrate one example of the equipment. However, as for other items and equipments and other product variations and the like, they can be determined by the same way as mentioned above.

The part property list stored in the equipment application database 21-1 will be described below in detail.

Figure 10:
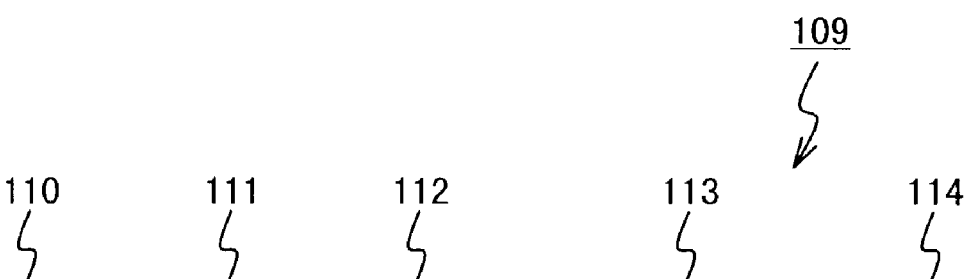
FIG. 10 is a view describing a part property list.

FIG. 10 is a view illustrating the data (the part property list data 109) of the part property list 86 shown in FIG. 9A in the equipment application database 21-1. It has a derivative 110, an item 111, an item name 112, an equipment configuration 113 and a part number 114.

The derivative 110 corresponds to the product variation code column 84.

The item 111 indicates the item number of the item 91.

The item name 112 corresponds to the item 91.

The equipment configuration 113 corresponds to the equipment check column 89 and indicates the obtainable combination with regard to the equipment in the equipment column 87.

The part number 114 corresponds to the part number column 88.

The CAD figure will be described below with reference to FIG. 11.

Figure 11:
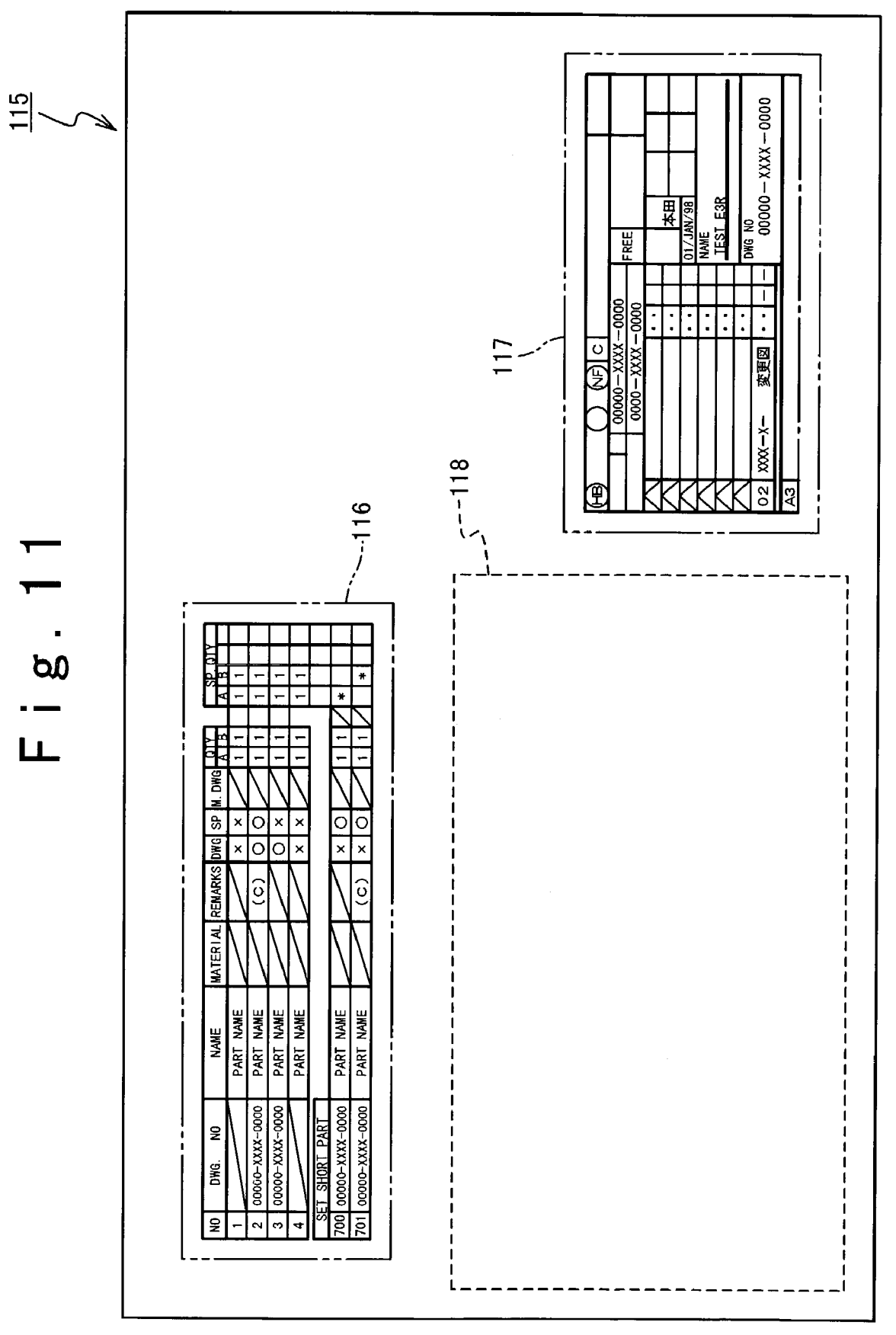

FIG. 11 is a view showing a display example of a CAD figure on a display screen, based on the CAD data. A CAD FIG. 115 has a configuration part column region 116, a title column region 117 and a 3D-figure region 118.

The configuration part column region 116 is the region in which the configuration part column is generated. The configuration part column mainly displays the configuration part (sub-part) column data. The sub-parts configure the main-part drawn on the CAD figure. The configuration part column data include a configuration number (a hierarchy of a part constituting a part drawn on the CAD figure), the sub-part numbers (configuration part number)/the sub-part names, and the like.

The title column region 117 is the region in which the title column is generated. The title column mainly displays the title column data of a main-part. The title column data include a part number of the main-part (a title part number), a part name, a design change number and the like, to specify a part drawn on the CAD figure.

The 3D-figure region 118 is the region in which a 3D-figure is generated. The 3D-figure region 118 mainly displays the CAD figure data (3D-figure) of the main-part and, in some cases, the sub-parts.

This embodiment describes the case of one title column and one part configuration column. However, the present invention is not limited to this case.

The method of extracting the attribute data in the title column and the configuration part column can use, for example, the following process.

(1) Predetermining the regions in the CAD figure in which the title column region 117/the configuration part column region 116 are generated. The regions are specified by the sets of coordinate on the display screen. The sets of coordinate are included in the region table stored in the CAD figure database 21-2.
(2) Finding out a data group composed of particular elements within the title column region 117/the configuration part column region 116, based on the region table.
(3) Extracting the attribute data from a position of the particular elements in each data group. Here, the attribute data have been composed of the particular elements.

Here, the CAD data is further explained.

Figure 12:
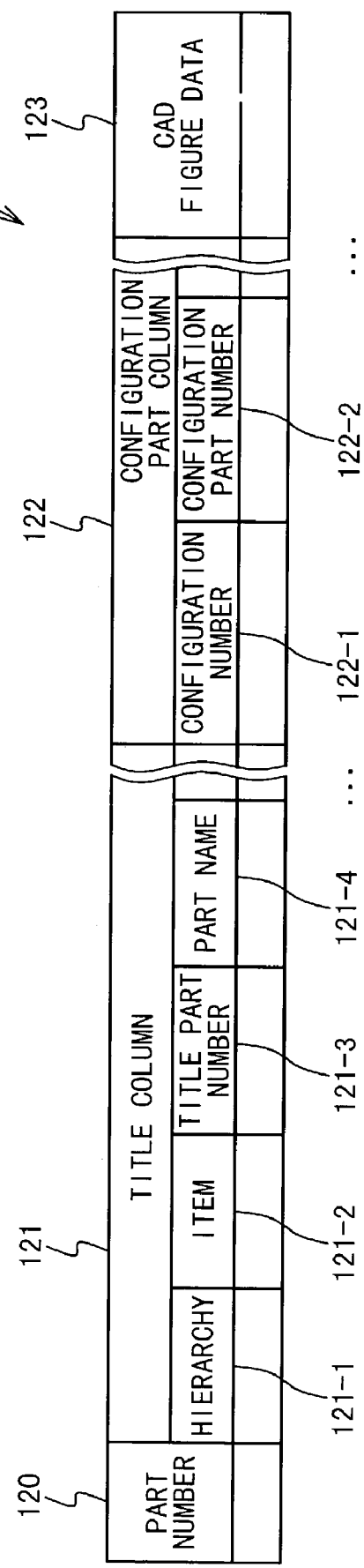
FIG. 12 is a flowchart describing a CAD data.

FIG. 12 is a view explaining a CAD data 119. It has a part number 120, a title column 121, a configuration part column 122 and a CAD figure data 123.

The part number 120 indicates the part number data (=the title part number) of a part drawn on a CAD figure.

The title column 121 is the title column data, including attribute data, exemplified as a hierarchy 121-1, an item 121-2, a title part number 121-3, a part name 121-4 and the like.

The configuration part column 122 is the configuration part column data, including the attribute data, exemplified as a configuration number 122-1, a configuration part number 122-2 and the like.

The CAD figure data 123 is the CAD figure data of a part number 120. The CAD figure data 123 may be obtained from the design data of an already-designed different model or may be independently generated by the designer.

The display of the figure as shown in FIG. 11 is one embodiment. It is not limited to this display.

The operation in the embodiment of the parts list apparatus in the present invention will be described below with reference to the attached drawings.

Figure 13:
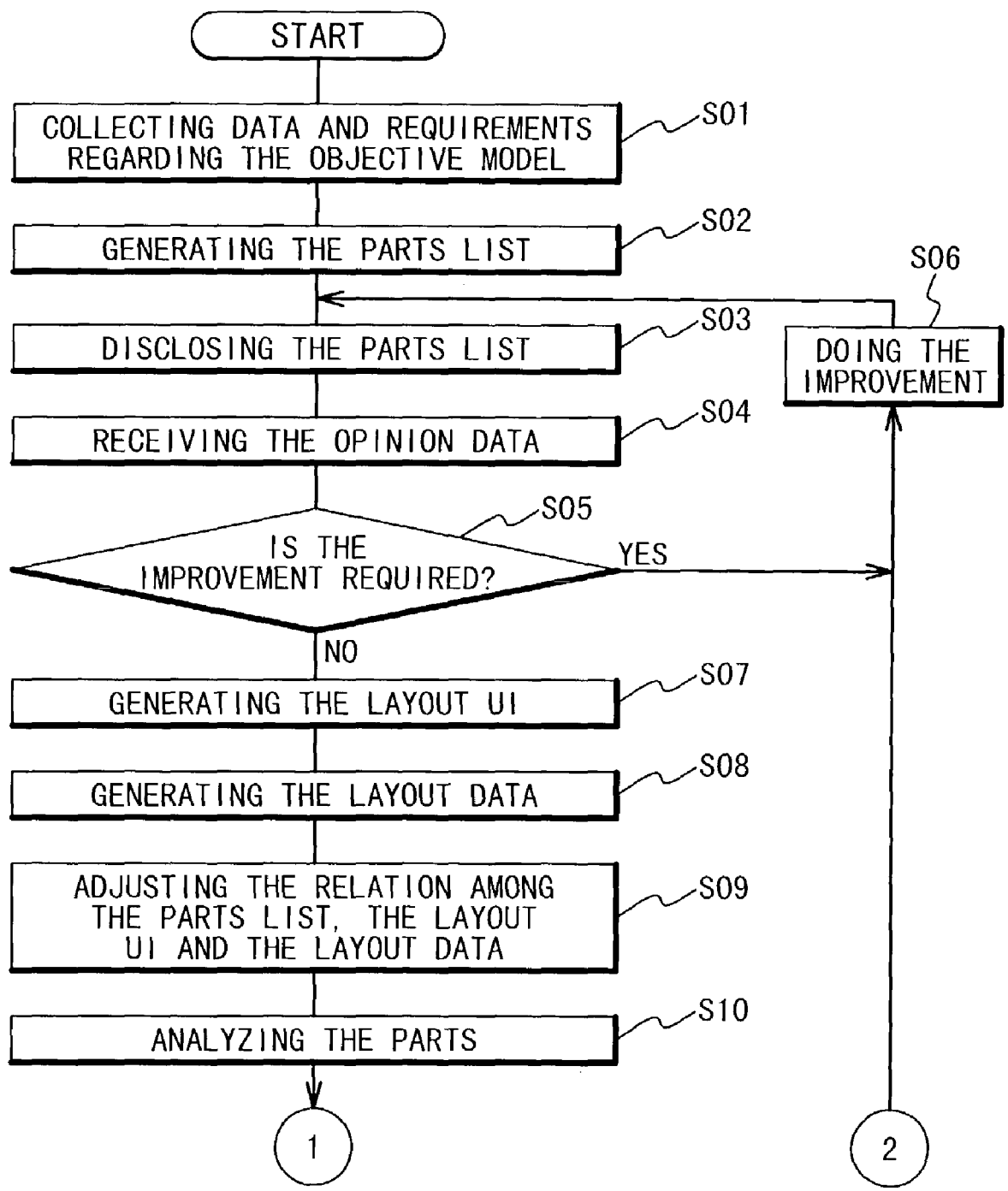
FIG. 13 is a flowchart showing an operation in an embodiment of a parts list system of the present invention (the first half)
Figure 14:
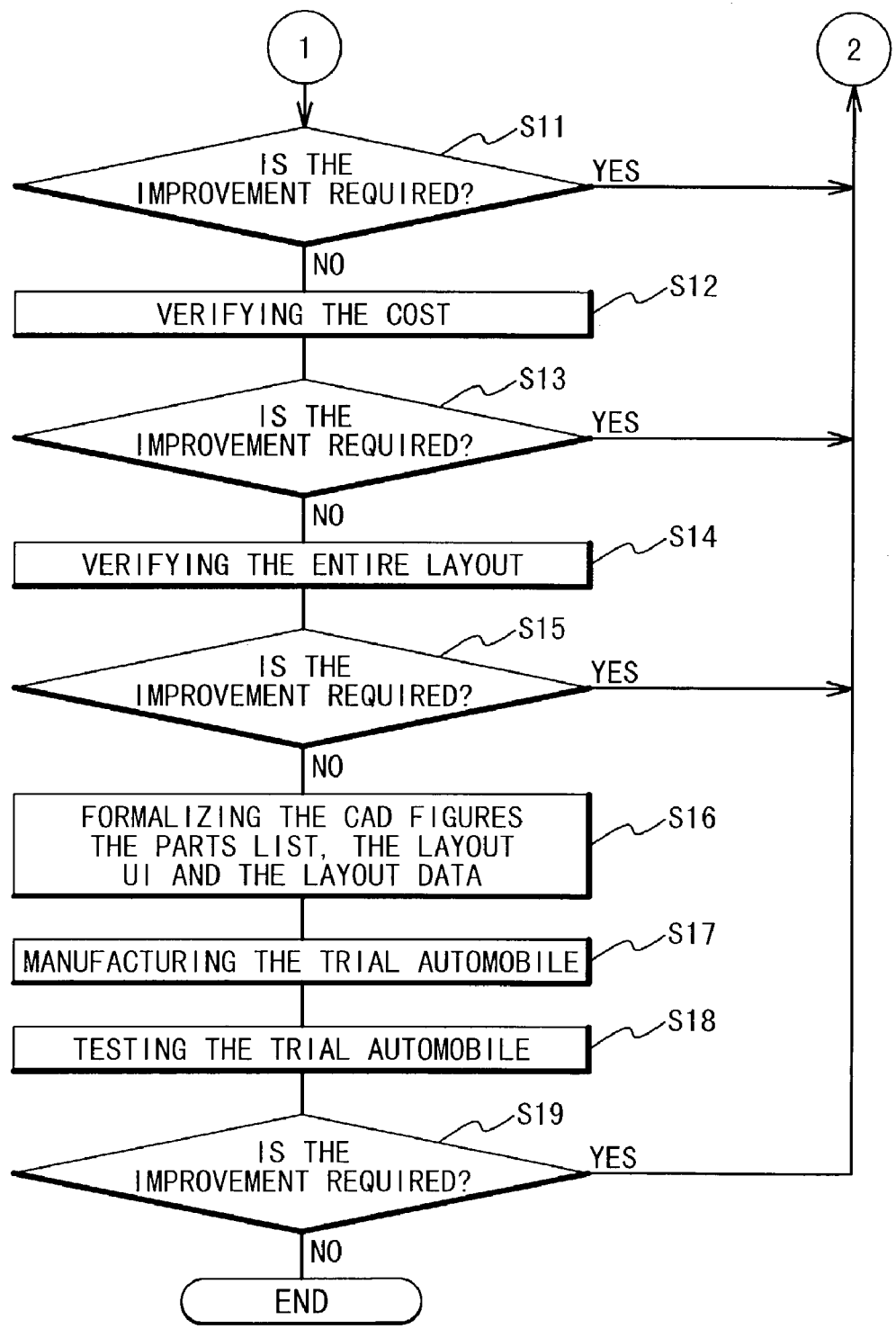
FIG. 14 is a flowchart showing an operation in an embodiment of a parts list system of the present invention (the second half)

FIG. 13 and FIG. 14 are a flowchart showing the operation in the embodiment of the parts list apparatus in the present invention.

(1) Step S01.

The designer collects the data required to design the objective model such as the development data, the standard requirement data, the know-how data, the other model data and the parts application data from the certain databases.

(2) Step S02

The designer makes the concept data of the objective model, based on the various data collected as mentioned above. Then, the designer inputs the part number, the part configuration data, the part application data, a memo data and the like, to the parts list section 13. The memo data is the memorial data written by the designer. The parts list section 13 generates the parts list having the form shown in FIG. 2. The parts list is in the concept stage, and it has not been completed yet. The parts list is stored in the parts list database 21-3.

Next, based on the concept data, the input of the designer and the above-mentioned various data, the equipment application section 11 generates the equipment specification list (FIG. 8A), the product variation list (FIGS. 8B and 9B), the part property list (FIG. 9A) and the equipment parts list (FIG. 9C). Next, based on these lists and the input of the designer, CAD section 12 generates the CAD data (FIG. 12). Then, the CAD section extracts the attribute data from the CAD data, and outputs it to the parts list section 13. The parts list section 13 inputs these data to the parts list (FIGS. 2 and 4). Its process will be explained later.

The parts list section 13 relates the item and the part number of the parts list to the concept data, above-mentioned lists such as the equipment specification list and CAD data.

Each of the parts list, concept data, above-mentioned lists such as the equipment specification list and CAD data is stored in the certain database as described before.

It is also possible to generate the parts list by using a parts list of the other model already-developed. In this case, the list is generated by modifying it. It can be effectively generated since the already generated list is used.

(3) Step S03

The parts list section 13 discloses the generated parts list to the pre-determined persons, in response to an operation indicating a permission of the disclosure from the designer.

The disclosure is carried out by allowing access to the parts list in the parts list database 21-3. Canceling a limit of an access to the list is also the method for the disclosure.

Here, by using ID, password and the like in accessing the parts list, the data is protected from being changed or deleted through the pre-determined persons.

Here, the pre-determined persons are exemplified by the engineers, the researchers, the person in charge of a technical evaluation, the other designer, the person in charge of a purchase and the person in charge of PL and the like.

At the time of the disclosure, the announcement of the disclosure is sent to the pre-determined persons from the parts list section 13, in response to the permission of the disclosure.

(4) Step S04.

The pre-determined persons access the parts list and consider the data of the parts list and the data linked to each part number.

The pre-determined persons return the opinion data as the considered result.

The returning method is carried out by writing the opinion data to the permitted region for each part number in the parts list, or providing the file attached to the parts list, or establishing the link of the opinion data and the parts list.

Here, opinion data may be included as a modification command which is the computer-readable command to modify the parts list or CAD figure. The modification command is pre-determined in the design system 1.

(5) Step S05

The designer analyzes (inspects) the opinion data. The opinion data can be easily checked by access to the parts list.

It is possible to decrease the time and the labor, and also possible to reduce the possibility of an oversight.

The designer judges whether or not the improvement (modification, change) of the respective parts in the parts list is required, from the opinion data. If the improvement is required, the operational flow proceeds to a step S06. If there is no opinion or if the improvement is not required, the operational flow proceeds to a step S07.

If the certain authority uses the modification command in the opinion data, it may be possible to make the part list or the CAD figure be modified automatically by the modification command. In this case, the designer may be checked after the auto-modification is finished.

(6) Step S06

The designer carries out the proper improvement (modification, change), based on the various data required to design the objective model, the concept data, the opinion data and the like. During the improvement, the disclosure is transiently suspended. After the improvement, the disclosure is again done at the step S03.

(7) Step S07

The layout UI section 14 firstly obtains a part number and its related data such as the part configuration data from the parts list. Next, it judges the kind of the part and the part mount position and the like for each part, based on the part number and the layout need table. Then, the layout UI section 14 generates the layout UI exemplified in FIG. 6, for all parts identified by the part numbers in the parts list. The layout UI is related to the parts list. That is, the part on the layout UI is related to the same part (the same part number) on the parts list.

The designer inputs the data based on the various data required for designing the objective model and the like, if necessary.

The layout UI is stored in the layout UI database 21-4.

(8) Step S08

The layout section 15 generates a sample for a layout data, based on the layout UI, and the parts list if necessary. Then, the layout is displayed as shown in FIG. 7.

The designer determines the arrangement (the layout) of the respective parts by using the layout section 15 on the display of FIG. 7. It is carried out, based on the part configuration data, the development data, the standard requirement data, the know-how data, the other model data and the opinion data, from the parts list and the layout UI.

The layout section 15 calculates and generates the layout data. The layout data includes the layout element position shape data, the layout element configuration data, the PN position shape link data, the part setting data, the inter parts data, the inter part layout element data, the part layout element dynamic data and part position shape data. Then, the layout data is stored in the layout database 21-5.

(9) Step S09

The layout section 15 relates the layout element position shape data, the PN position shape link data, the part setting data and the part position shape data to the parts list and the layout UI.

If necessary, the relation among the parts list, the layout UI and the layout data is adjusted. It is carried out, based on the data such as the other model data, the know-how, the achievement standard common to all models, the data and the standard and the condition of the objective model, the technical problem, the countermeasures request table, the step schedule and the like.

(10) Step S10

The analysis section 16 collects the part and its related data such as the part configuration data, the part position, the shape, the material quality, the welding point and the like for each part, from the parts list, and the layout UI or layout data. At the same time, the name of the analyzing program for the part is obtained from the parts list. Then, the analysis section 16 analyzes the part by the analyzing program, based on the collected data. The result of the analysis (the analysis result) and analysis report made by the designer based on the analysis result are assembled in an analysis data, and linked to the corresponding part number in the parts list. The analysis data is stored in the evaluation database 218.

(11) Step S11

The designer considers whether or not the improvement of the respective parts in the parts list is required, from the analysis data. It is considered, based on the comparison between the analysis data and the thermal, structural and dynamic requirement (the allowable range) that is stored in the analysis database 21-6.

If the improvement is judged to be required, the operational flow proceeds to the step S06. If there is no problem in the analysis result, the operational flow proceeds to a step S12.

(12) Step S12

The evaluation section 17 selects the data required to calculate a cost, from the parts list, and the layout UI or layout data. The data required to calculate the cost are the part configuration data, the part shape, the part volume, the material quality, the welding point, the number of the automobiles to be manufactured, the diversion part cost and the like. Also, the designer inputs the step of manufacturing the part, and other data if necessary. Then, the evaluation section 17 calculates the cost, based on their data and the cost table. As the result of the cost calculation, the material cost, the assemble cost, the process cost, the mold cost, the depreciation cost, the investment, the part purchase cost and the managing cost are calculated and outputted as a cost verification document.

The evaluation section 17 generates a comparison table to compare that cost verification document with a cost verification document related to the similar part of the other model or a past cost verification document of the objective model. And the evaluation section 17 verifies whether or not the cost satisfies the preset condition, based on that table, and generates a cost verification result.

The cost verification document and the cost verification result are linked to the corresponding part number in the parts list, and stored in the cost database 21-7.

(13) Step S13

The designer considers whether or not the improvement of the respective parts in the parts list is required, from the cost verification result. If the improvement is judged to be required, the operational flow proceeds to the step S06. If there is no problem in the cost verification result, the operational flow proceeds to a step S14.

(14) Step S14

The verification section 18 obtains the parts application data, the part configuration data and the part position shape data from the parts list, and the layout UI or layout data having all parts of the objective model. Then, it generates the entire layout data corresponding to one automobile of the entire objective model, based on the data.

Next, The verification section 18 obtains the data, such as the know-how, the common requirement to be achieved for the objective model, and the like from the databases, and display them.

The designer (or the verification section 18) verifies the entire layout corresponding to one unit, based on their data. The verified result is linked to the parts list and layout UI. The entire layout data and the entire layout verification result are stored in the evaluation database 21-8.

(15) Step S15

The designer considers whether or not the improvement of the respective parts in the parts list is required, from the entire layout verification result. If the improvement is judged to be required, the operational flow proceeds to the step S06. If there is no problem in the entire layout verification result, the operational flow proceeds to a step S16.

(16) Step S16

The figure output section 19 generates a plurality of figure output UIs, based on the parts list and a specification report. Then, it outputs the CAD data (CAD figures) at every package, based on the data of this figure output UI.

After that, the CAD section 12 and the parts list section 13 authorize (regularize) the CAD figures (the CAD data). The authorizing process will be explained later.

The CAD figures are inspected by a manager having an admission right, based on the part number, the figure, the specification report, the configuration data and the parts application data, for each figure output UI. If the CAD figures are permitted by the figure inspection, the designer formally registers (formalizes) the CAD figure, the parts list, the layout UI and the layout data.

(17) Step S17

The related departments determine a automobile allocation plan, a producing plan, a manufacturer name, an allocation plan and a delivery plan, which are the data related to the production. Those data are stored in the production database 21-9. Then, they are related to the related respective parts in the parts list.

The person in the related department of the manufacture of the automobile obtains the data related to the necessary production from the parts list, and manufactures the trial automobile.

(18) Step S18

The producer, the engineer and the person in charge of the part manufacturer generate the countermeasures request note against a problematic part, with regard to a problem occurring at the trial stage. Then, the file of the countermeasures request note is related to the part on the parts list. The countermeasures request note is stored in the production database 21-9.

Also, the person in charge of the test obtains the data (a automobile allocation plan, an A request table, a proposal specification, a different car test result and the like) related to the test from the parts list. He/she tests the trial automobile and generates the test report of the test result and its countermeasure idea. Then, the file of the test countermeasure data as the test report and the countermeasure idea is related to the part on the parts list. The test countermeasure data is stored in the production database 21-9.

(19) Step S19

The designer considers whether or not the improvement of the respective parts in the parts list is required, from the test countermeasure data. If the improvement is judged to be required, the operational flow proceeds to the step S06.

Then, this process is performed on all parts on the parts list, until the necessity of the improvement is eliminated.

On and after the step S16 of the above-mentioned process, there may be the part that can be used in its original state, without any improvement. On the other hand, there may be the part requiring to be improved. Even in such a case, the state of the individual part is defined and discriminated on the parts list ("state 29"), based on the data structure. Thus, the data of the permitted part (which does not require the improvement) and the data of the no-permitted part (which requires the improvement) can be treated on the same parts list.

Then, it is possible to use the same parts list to unitarily manage the data of the part from making the concept stage to the final determination stage.

The process at the step S02 for generating the lists, the CAD data and the parts list by the equipment application section 11, the CAD section 12 and the parts list section 13 will be described below.

Figure 15:
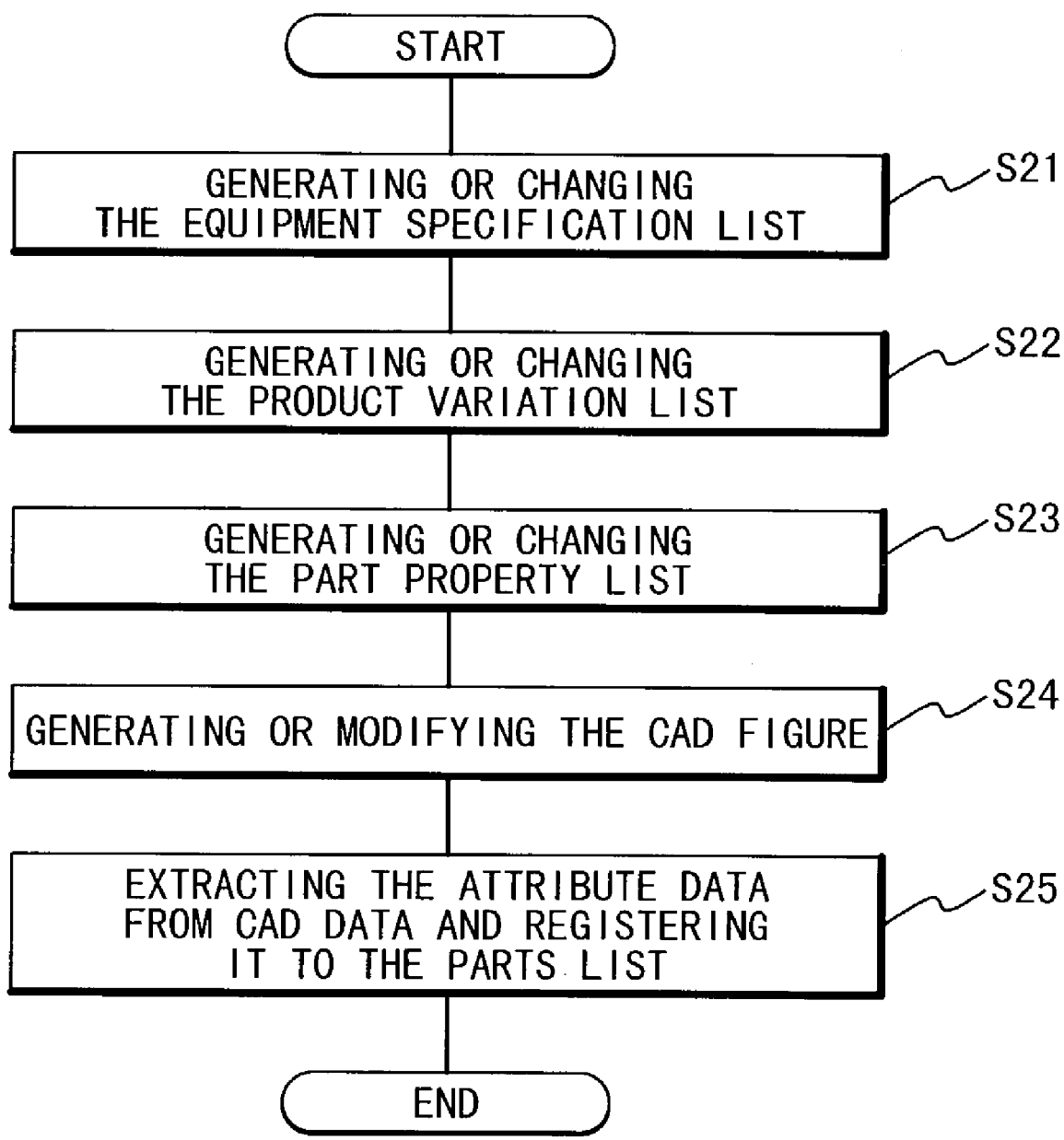
FIG. 15 is a flowchart showing a method of generating an equipment specification list included in a step S02.

FIG. 15 is a flowchart showing the preparation process of the equipment specification list, the product variation list, the part property list, the equipment parts list, the CAD data and the parts list.

(1) Step S21

The designer determines or changes the kinds of the product and the specifications. Here, the car model and the kinds of the type (the derivative models), the kinds of the equipment used in them and the combinations thereof are determined or changed.

Then, the designer inputs or changes the part number, the part configuration data, the part application data, a memo data and the like, to the parts list section 13. The parts list section 13 generates or changes the parts list having the form shown in FIG. 2.

The equipment application section 11 generates or changes the equipment specification list 76, based on the determined or changed data, as mentioned above, inputted by the designer.

(2) Step S22

The equipment application section 11, based on the derivative models and a plurality of equipment in the equipment specification list 76, calculates the respective combinations of the plurality of equipment as equipment variations. Then, it generates or changes the product variation list 81, based on the equipment variations and the derivative models (products). Each equipment variation corresponds to each product variation.

(3) Step S23

The designer determines or changes the specification-specified equipment and the part number used for each item in accordance with the specification-specified equipment. Then, they are inputted to the equipment application section 11.

The equipment application section 11 calculates the specification-specified equipment variation based on the plurality of specification-specified equipment. Then, it generates or changes the part property list 86, based on the calculation results.

The equipment application section 11 generates or changes the equipment parts list 100, based on the product variation list 81 and the part property list 86.

(4) Step S24

The designer makes the concept about the generation of the part and the design change, based on the reference to and the consideration of the various data including the equipment specification list 76, the product variation list 81, the part property list 86, the equipment parts list 100.

The designer designs the parts for each item, based on the concept for each part number (the part number of the first hierarchy) in the part property list 86.

The CAD section 12 generates or modifies the CAD figure, based on the data regarding the design of the part or the input by the designer. Incidentally, in the case of the modification of the figure, the CAD section 12, after reading out the figure of that part from the CAD figure database, modifies it, based on the input by the designer.

(5) Step S25

After whether or not the figure complies with the preset standard is inspected, the CAD section 12 extracts the attribute data from the title column 121 and the configuration part column 122 of the CAD data 119. The extracting process is as mentioned before at FIG. 11.

The parts list section 13 receives the attribute data from the CAD section 12. Then, it registers the received attribute data in the parts list of the parts list database 21-3, based on the coincidence of the part number and the attribution corresponding table.

From the above-mentioned processes, the equipment specification list, the product variation list, the part property list, the equipment parts list, the CAD data and the parts list which are included at the step S02, are generated. Also, the similar process can be used even in the change at the step S06. However, in the case of the change, all of the steps S21 to S25 may not be carried out.

The above-mentioned processes have been explained by exemplifying some of the equipment, the items and the parts in relation to the design of the automobile. However, the present invention is not limited to them. It can be applied to all types of equipment, items and parts.

Due to the above-mentioned processes, the designer need not calculate the kind of the product to be designed, when the equipment variation is generated from the equipment specification list. The designer need not instruct the part applications through manual work to all variations, one by one, when the parts list is generated from the product variation list. Also, the equipment specification list —the product variation list—the part property list—the equipment pats list—the figure—the parts list can be generated in that order continuously and substantially automatically. Thus, the burden on the designer is reduced, and the process is made faster by the data process, which leads to the improvement of the accuracy.

The formalizing process at the step S16 will be described below.

Figure 16:
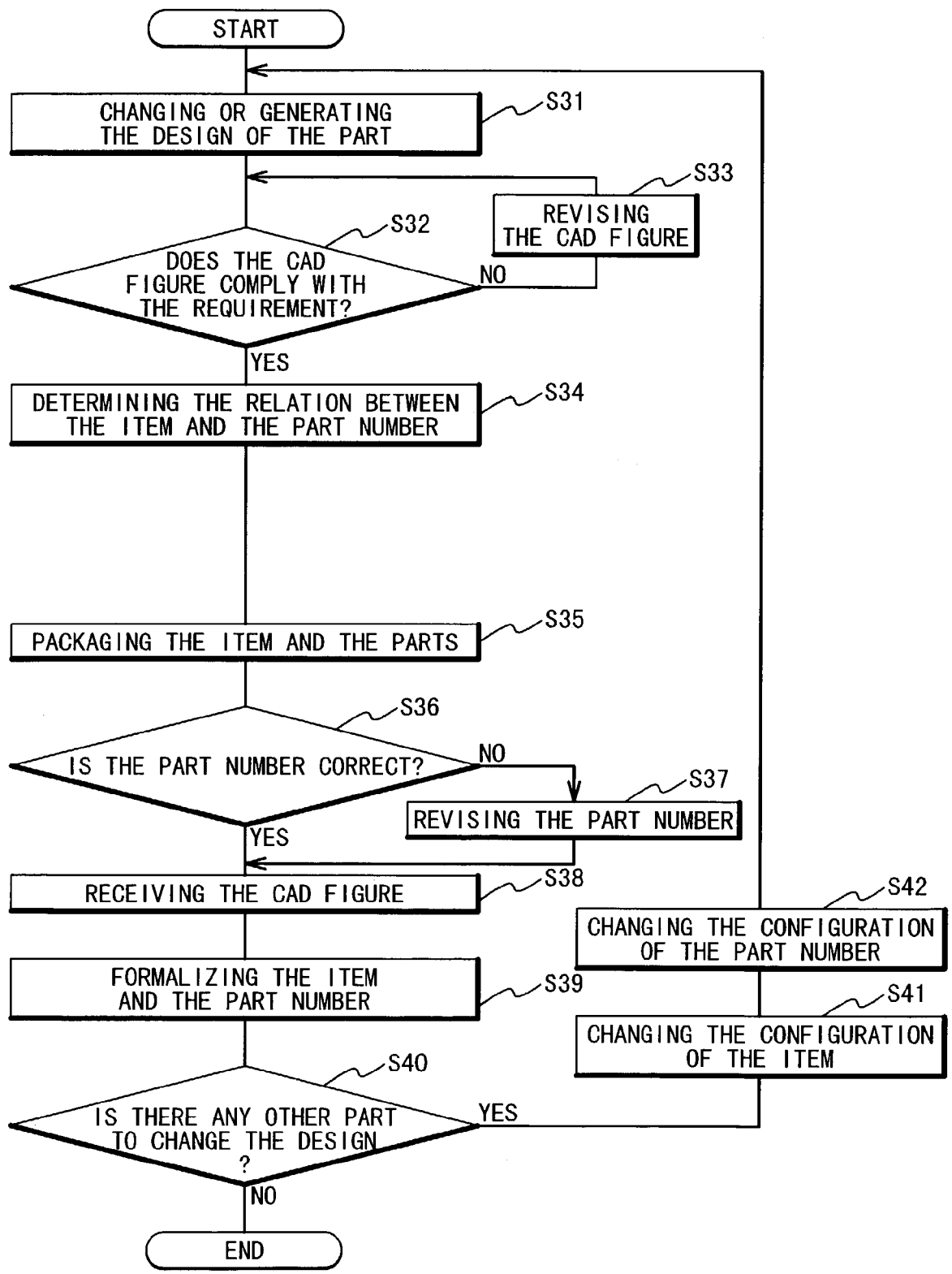
FIG. 16 is a flowchart describing a formalizing process.

FIG. 16 is a flowchart illustrating the formalizing process.

(1) Step S31.

At the steps S01 to S15, regarding to the change or generation of the design of the part, the content of the part in the parts list 21-3' is changed or generated. Here, step S31 means the steps S01 to S15.

At this stage, statuses A31/B33/C36 of the part in the parts list 21-3' are (or become) a1/b1/c1. The combination of the statuses of a1/b1/c1 indicates that the data of the part can be freely changed, which is shown in the state judgment list 60. It is indicated by the proper sign (or symbol) in the state 29 (and the display of the state 57). Here, status D39, the figure flag and the total flag are reset.

(2) Step S32

The CAD section 12 inspects whether or not the CAD figure complies with the standard requirement of figures in the CAD figure database 21-2.

The CAD figure is completed when it complies with the standard requirement of figures.

Based on the completion of the CAD figure, the parts list section 13 sets a figure flag 34 of the part of the parts list 21-3'.

The statuses A31/B33/C36 still remain at a1/b1/c1. The combination of the statuses of a1/b1/c1 and the figure flag indicates that the deletion of the part number 32 and the part configuration 41 of the part are not permitted, according to the state judgment list 60. It is indicated by the proper sign (or symbol) for the state 29 (and the display of the state 57).

After that, when the CAD figure is completed, the operational flow proceeds to a step S34. When the CAD figure does not comply with the standard requirement and the CAD figure is not completed, the operational flow proceeds to a step S33.

(3) Step S33

Since the CAD figure does not comply with the standard requirement of figures, the CAD section 12 displays its fact and the content of the requirement that the CAD figure does not comply, for the designer.

The designer modifies the CAD figure, based on the content. The operational flow returns back to the step S32.

(4) Step S34

The parts list section 13 determines the relation between the item 30 and the part number 32 of the part used therein, based on the completion of the CAD figure. At the same time, it changes the statuses A31/B33/C36 to a2/b1/c1. The combination of the statuses of a2/b1/c1 and the figure flag indicates that the change of the application 40 (the parts application data of the configuration data display section 53) of the part is not permitted, from the state judgment list 60. Here, also, the deletion of the part number 32 and the part configuration 41 are not permitted, as mentioned above. It is indicated by the proper sign (or symbol) for the state 29 (and the display of the state 57).

(5) Step S35

Based on a plurality of part numbers in the part number 32 of the parts constituting the item 30, the parts list section 13 writes these part numbers to the package 35. At the same time, the statuses A31/B33/C36 are changed to a2/b1/c2. The combination of the statuses of a2/b1/c2 and the figure flag indicates that the operation (the deletion, the change or the addition) of the part number 32 and the part configuration 41 of the part are not permitted, from the state judgment list 60. Here, also, the change of the application 40 is not permitted, as mentioned above. It is indicated by the proper sign (or symbol) for the state 29 (and the display of the state 57).

Here, the item 30 corresponds to the package. However, the package may be constituted by the set of parts, which is not limited to each item. In this case, the designer determines the set of the part number 32 constituting a package. The CAD figures of the package are collectively inspected at a unit of the design change.

(6) Step S36

The parts list section 13 inspects totally whether or not the part numbers are correct, with regard to the item 30 and the plurality of part numbers 32 packaged at the unit of the design change. The inspecting method will be described later.

The total inspection of the CAD figure is completed when there is no problem in the CAD figure.

At this time, the parts list section 13 sets the total flag of the total flag 37 of the part, at the same time. However, the statuses A31/B33/C36 are still at a2/b1/c2. The combination of the statuses of a2/b1/c2, the figure flag and the total flag indicates the completion of the total inspection of the part. This is indicated by the proper sign (or symbol) for the state 29 (and the display of the state 57), based on the state judgment list 60.

After that, when the total inspection of the CAD figure is completed, the operational flow proceeds to a step S38. When there is a problem and the total inspection is not completed, the operational flow proceeds to a step S37.

(7) Step S37

Since there is a problem in the part number 32, the parts list section 13 carries out the display indicating its fact and the problematic content, for the designer.

The designer modifies the part number of the CAD figure and the parts list 21-3', based on its content.

(8) Step S38

The package composed of the set of the CAD figures is completed based on the end of the total inspection.

The parts list section 13 outputs (figure-outputs) the CAD figure, and the CAD figure is received by a figure managing system (not shown) belonging to the managing department of the design change. At the same time, it changes the statuses A31/B33/C36 to a3/b2/c2. The combination of the statuses of a3/b2/c2, the figure flag and the total flag indicates the output of the CAD figures of the part. This is reflected in the state 29 (and the display of the state 57), based on the state judgment list 60.

The designer submits the output figures to the managing department of the design change.

(9) Step S39

Based on the data indicating the permission of the design change from the figure managing system, the parts list section 13 formalizes the item 30 and the part number 32. At this stage, the design change is formally registered in the corresponding portion of the parts list 21-3' in the parts list database 21-3. It results in the situation that the change of the data regarding to the part in the parts list 21-3' is not permitted.

At this time, the parts list section 13 sets the status D39 from nothing to d1. The statuses A31/B33/C36 are still at the a3/b2/c2. The combination of the statuses of a3/b2/c2/d1, the figure flag and the total flag indicates the formal registration of the design change in the corresponding portion (the part) of the parts list 21-3'. This is reflected in the state 29 (and the display of the state 57), based on the state judgment list 60.

This state also indicates that the parts list section 13 allows the operation (deletion, change or addition) of data corresponding to the new (other) part number in the part number display section 52 and the parts application data in the configuration data display section 53.

(10) Step S40

If there is some other part in the item requesting a design change in the parts list 23-1', the operational flow proceeds to a step S41. If not so, it is ended.

(11) Step S41

The parts list section 13 changes the configuration of the item 30 (the item number) of the item, if it is necessary for the design change process, based on the input of the designer.

At this time, the parts list section 13 changes the statuses A31/B33/C36 of the other part of the item under the design change process to a1/b1/c1 of the parts in the item. This is reflected in the state 29 (and the display of the state 57), based on the state judgment list 60. Here, status D39, the figure flag and the total flag are reset.

(12) Step S42

The parts list section 13 changes the configuration of the part number 32 of the item, if it is necessary for the design change process, based on the input of the designer.

At this time, the statuses A31/B33/C36 are still at a1/b1/c1. The operational flow returns back to the step S31.

The designer executes this process, for all of the parts (and items) requesting the design changes.

At each of the steps in the above process, based on the states (the combination of the statuses A31/B33/C36/D39, the figure flag and the total flag), it is possible to discriminate among the states of the parts (the concept stage, the figure checking stage, the totally checking stage, the figure output stage, the formalizing stage).

Consequently, even if the part data at the concept stage is written to the parts list before the formalization, whether or not it is formal can be precisely grasped. That is, even if the part data with regard to the parts at the various stages are mixed and noted on the same parts list, from the state data, it is possible to execute the strict management of the respective part data.

Then, the usage of the same parts list enables the part data from the concept stage to the final determination to be unitarily managed.

The method of inspecting whether or not the part number at the above-mentioned step S36 is formal (the totally inspecting method) will be described below.

Figure 17:
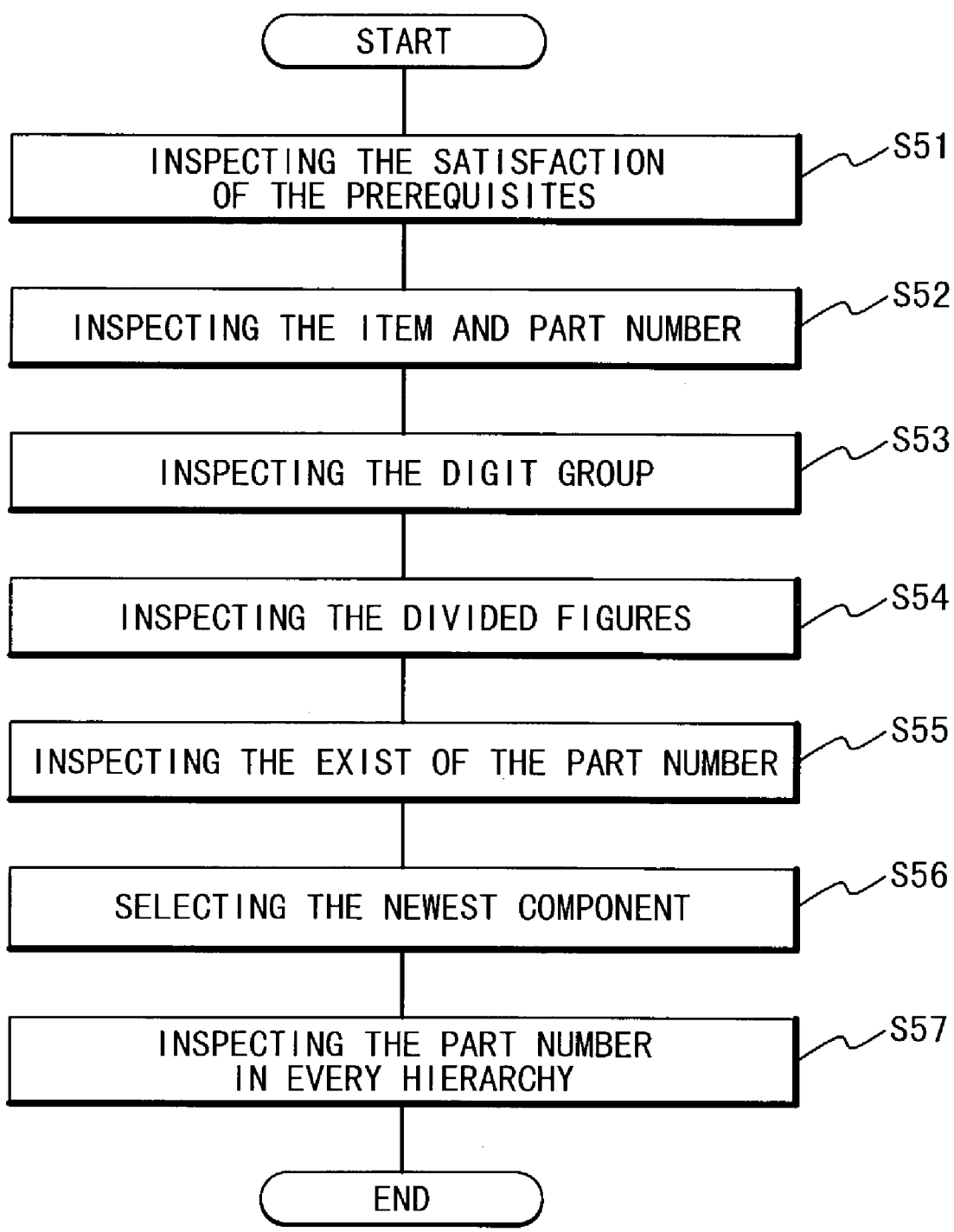
FIG. 17 is a flowchart showing a totally inspecting method at a step S06.

FIG. 17 is a flowchart showing the totally inspecting method at the step S36.

The figure output UI, which includes the part data of the parts list 21-3' of each package, links the part property list 109 and CAD data 119 of the package.

(1) Step S51.

The parts list section 13 inspects whether or not the packaged data satisfies the prerequisites.

The prerequisites include (a) to (c). (a) Whether or not the part number complies with a number setting rule. (b) Whether or not the data of the package targeted for the inspection is used in the different programs. (c) Whether or not the part in the package targeted for the inspection is contained in a different package. The item (a) can be checked based on the rule (the number is composed of the alphanumeric characters, n digits—m digits—p digits, and the like) of the part number rule table (not shown). The item (b) can be confirmed by checking a presence or absence of a temporary file, or preliminarily setting the data for the flag indicating its state. And, the item (c) can be confirmed by checking a part numbers of the different packages.

The prerequisites are not limited to the above examples ((a) to (c)).

(2) Step S52

The parts list section 13 picks up the item 111 and the part number 114 of the part property list 109 of each part within the package. Then, the parts list section 13 searches the item 30 and part number 32 that have the same numbers as the item 111 and the part number 114 respectively in the parts list 21-3'. The parts list section 13 also examines whether or not the part of the part number 32 is in the first hierarchy.

This is the confirmation for designing the part of the part property list 109 as the part in the first hierarchy.

At the same time, the parts list section 13 also examines whether or not the head portion of the part number 32 is equal to the portion of the item 30. Here, with reference to FIG. 2, the part number is explained.

In FIG. 2, for example, they are as follows.
Item 58-a: F01 4220B
Part Number of 1st Hierarchy 58-b:
42200-S2MF-0000
Part Number of 2nd Hierarchy 58-c:
42230-S2MF-0000

The head portion of the part number 58-b of the first hierarchy and the portion of the part number on the item 58-a must be equal to each other. Here, "422" of 58-b is equal to the "422" of 58-a.

If this can not be confirmed, it is judged as an error.

From this inspection, it is confirmed that the part number 111 corresponding to the item 114 of the part in the part property list 109 exists on the parts list 21-3' of the item 30 and the part number 32.

(3) Step S53

The parts list section 13 inspects whether or not the part number 32 having the same digit group in any of all other packages, based on the part number 32 in the parts list 21-3'. Here, the digit group, indicating the kind of the part, has a plurality of digits and each digit contains one of the alphanumeric characters.

For example, in [Part Number of First Hierarchy 58-b: 42200-S2MF-0000], let us suppose that the entire four digits [0000] which are the third numeral group is the digit group as mentioned above.

In this case, if a plurality of part numbers 32 having the same digit group exist in any of all other packages, this is judged as an error.

Consequently, it is possible to avoid the part numbers 32 of the same kind from being packaged in a plurality of packages.

(4) Step S54

The parts list section 13 inspects whether or not divided figures are all gathered, based on the part number 32 of the parts list 21-3'.

For example, the part number 32 is indicated by the alphanumeric characters such as XXXXX-YYYY-ZZZZ. The part number 32 of the part having a plurality of divided figures is indicated by the XXXXX-YYYY-ZZZZ-AA. The auxiliary numbers (-AA) are represented as numbers of the divided figures.

The parts list section 13 inspects the part numbers 32 having the digits AA as to whether or not all of the alphanumeric characters of the digits of the XXXXX-YYYY-ZZZZ are equal, and whether or not the digits AA are consecutive numbers. Then, if the numerals of the digits AA are not consecutive or only one digit exists, this is judged as an error.

Due to this inspection, although there are the divided figures, the situation that some of those figures are not packaged can be avoided.

(5) Step S55

The parts list section 13 inspects the structure of the part number, based on the hierarchy 28 in the parts list 21-3'.

The configuration part number 122-2 noted in the configuration part column 122 in the CAD figure is the sub-part (or the low order hierarchy) constituting the main-part (or the high order hierarchy) drawn on the CAD figure. Namely, the member indicating sub-part of the part number 32 in the parts list 21-3' is the part having the part number noted in the configuration part number 43 (=the configuration part number 122-2). Thus, it is necessary that the data exists within the same package as the part number 32 (=the part drawn on the CAD figure). So, it is checked whether or not the part having the same part number as the plurality of part numbers in the configuration part number 43 exists within the parts list 21-3'.

If it can-not be confirmed, this is judged as an error.

Due to this inspection, with regard to the part (configuration part) constituting the part located below the first hierarchy, downwardly, it is possible to surely confirm the main-part sub-part relation (the relational tree structure or the part number structure).

(6) Step S56

The parts list section 13 selects the largest numeral from the numerals in the change/modification digits of the part number 32 in which the portion except the change/modification digits are equal. Here, the change/modification digits are some of the digits in the part number, which indicates the change/modification version of the part data.

That is, it selects the newest component on the parts list, and removes the remainders.

For example, in Part Number 58-b of First Hierarchy: 42200-S2MF-0000 in the step S52, let us suppose that the digits of the lower two digits 00 of 0000 which are the group of the third alphanumeric character are the change/modification digits. In this case, the newest part number (for example, an order of increasing the numerals) of the change/modification digits is left, for the part numbers in which the portions except the change/modification digits are equal. Then, the data of the other part numbers are removed.

Due to this inspection, all of the data regarding the part numbers before the execution of the change/modification in spite of the same part, can be removed to leave only the necessary newest data.

(7) Step S57

The parts list section 13 inspects the part number according to the part number structure confirmed at the step S53, from the lowest order hierarchy toward the high order hierarchy in each part number. The parts list section 13 checks whether or not the same part number as the part number targeted for the check exists in the high order hierarchy. That is, as for the part (the hierarchy 28, the part number 32) targeted for the check, it inspects a part in a hierarchy 28' higher than the hierarchy 28 by one rank, in which the part (the hierarchy 28', a part number 32') contains the part number 32 in the configuration part number 43. It similarly inspects the found part (the hierarchy 28', the part number 32'), in the high order hierarchy 28". Finally, whether or not it reaches the part number of the first hierarchy (the hierarchy 28''') is examined. The number of the hierarchies is below 10. Thus, if it does not reach the first hierarchy when it climbs correspondingly to the 10 hierarchies, this is regarded as the formation of a loop (the part number located in the low hierarchy exists even in the high hierarchy). Hence, this is judged as an error.

Also, the presence or absence of the item data is confirmed. That is, in the stage of the arrival at the first hierarchy, if it reaches the first hierarchy, whether or not the item and the application data exist is examined.

In the above-mentioned processes, if the error occurs, the designer and other persons adjust the part number, and the process is again carried out from the initial stage. The reason why the process is not done from the middle stage is that the adjustment of the part number may bring about a different trouble.

Due to the above-mentioned processes, the establishment of the item and the part number in the parts list 21-3' and the part property list 86 (109) having the direct relation to the part number can be checked surely and automatically.

In the present invention, the parts list is opened. Thus, the data and the data in relation to the development can be opened (disclosed), to the persons concerned in the development without any omission. Hence, it is possible to widely obtain the opinions from the persons concerned in the development at the suitable timings.

According to the present invention, all of the data related to the parts list are interiorly packed or related (linked). Thus, it is possible to integrally manage the design data such as the coupling of respective part configurations and all derivative models and the like.

According to the present invention, the data of one part in the parts list are independent from those of other parts in the same parts list. Thus, it is possible to handle the data of the one part, even though the state of the one part is different from that of others.

According to the present invention, it is possible to unitarily manage the data of the parts from the planning/scheduling stage to the completion of the figure. Also, the data and the data in relation to the development can be shared with the persons concerned in the development through the parts list. Moreover, it is possible to improve the accuracy of the part table management and also possible to shorten the development period.

Although there has been described what is the present embodiment of the invention, it will be understood by persons skilled in the art that variation and modifications may be made thereto without departing from the spirit or essence of the invention.

What is claimed is:

1. A parts list system comprising:
    a CAD section which generates a CAD figure of a part included in an apparatus based on design reference data, and extracts a part number of said part, configuration part numbers and attribute data from said CAD figure, wherein said design reference data is references for designing said apparatus, said configuration part numbers are part numbers of configuration parts of said part, and said attribute data indicate properties of said part and said configuration parts; and
    a parts list section which generates a parts list of said apparatus based on said part number, said configuration part numbers and said attribute data extracted from said CAD figure, and said design reference data, wherein said parts list relates said part number, said configuration part numbers and part data, said part data indicate properties of said part and said configuration part and include said attribute data;
    wherein said CAD section modifies said CAD figure based on a modification command, and extracts said part number, said configuration part numbers and said attribute data from the modified CAD figure, said modification command indicates a command for modifying design of said part and is inputted through a network when said parts list section discloses said parts list on said network,
    wherein said parts list section modifies said parts list, based on said part number, said configuration part numbers and said attribute data extracted from said modified CAD figure, and
    wherein said parts list section permits part modification and storage of commentary by persons other than an original designer.

2. The parts list system according to claim 1, wherein said CAD section extracts another part number of another part, other configuration part numbers and other attribute data from another CAD figure, wherein said other configuration part numbers are part numbers of other configuration parts of said another part, and said other attribute data indicate properties of said another part and said other configuration parts, and
    wherein said parts list section modifies said parts list based on said another part number, said other configuration parts number and said other attribute data extracted from said another CAD figure, and said design reference data, wherein said parts list relates said another part number, said other configuration part numbers and may relate to other part data.

3. The parts list system according to claim 1, further comprising:
    a layout interface database which stores layout need data relating said part number, said part data, and position and range of said part arranged in said apparatus; and
    a layout section which generates layout data indicating a layout of said part in said apparatus, based on said part number, said part data and said layout need data;
    wherein said parts list section modifies said parts list based on said layout data.

4. The parts list system according to claim 3, further comprising:
    an analysis database which stores an analysis method related to said part; and
    an analysis section which analyzes said part arranged in said apparatus by using said analysis method, based on said parts list and said layout data;
    wherein said CAD section modifies said CAD figure based on said analysis result, and extracts said part number, said configuration part numbers and said attribute data from the modified CAD figure, and
    wherein said parts list section modifies said parts list based on said part number, said configuration part numbers and said attribute data extracted from the modified CAD figure.

5. The parts list system according to claim 4, further comprising:
    a cost database which stores cost data relating said part data and costs related to manufacturing said part; and
    an evaluation section which estimates manufacture cost of said part, based on said part data and said cost data;
    wherein said CAD section modifies said CAD figure based on said manufacture cost, and extracts said part number, said configuration part numbers and said attribute data from the modified CAD figure, and
    wherein said parts list section modifies said parts list, based on said part number, said configuration part numbers and said attribute data extracted from the modified CAD figure.

6. The parts list system according to claim 5, further comprising:
    a verification section which generates an entire layout data, based on said parts list and said layout data of all parts, wherein said entire layout data indicates a layout of said all parts in said apparatus;
    wherein said CAD section modifies said CAD figure of a certain part of said all parts based on said entire layout data, and extracts said part number, said configuration part numbers and said attribute data regarding said certain part from the modified CAD figure, wherein said certain part should be a changed design, based on said entire layout data, and wherein said parts list section modifies said parts list based on said part number, said configuration part numbers and said attribute data extracted from the modified CAD figure.

7. The parts list system according to claim 6, further comprising:
   a figure output section which checks said part numbers in said parts list, based on a rule for preparing said part number, by performing one or more of a determination of compliance with a part number setting rule, an analysis of digit groups and of grouping of divided figures, and verification of existence;
   wherein said figure output section generates an output figure interface based on a plurality of packages, and outputs CAD figures for each package, said output figure interface is generated by reconfiguring said parts list based on said plurality of packages, said plurality of packages are groups including a plurality of said parts and are generated by dividing said all parts into said groups.

8. The parts list system according to claim 6, wherein said CAD section extracts data from the modified CAD figure by locating the data within the modified CAD figure using coordinate data, and then reading data from the location specified by the coordinate data.

9. A parts list generating method comprising the steps of:
   (a1) generating a parts list of an apparatus, based on design reference data, wherein said parts list relates a part number, configuration part numbers and part data, said part is included in said apparatus, said configuration part numbers are part numbers of configuration parts of said part, said part data indicate properties of said part and said configuration parts, and said design reference data are references for designing said apparatus;
   (b1) generating a CAD figure of said part, based on said design reference data and said part number, and extracting said part number, said configuration part numbers and attribute data from said CAD figure, wherein said CAD figure includes said part number, said configuration part numbers and said attribute data, said attribute data indicate properties of said part and said configuration parts included in said part data;
   (c1) modifying said parts list based on said part number, said configuration part numbers and said attribute data from a modified CAD figure, said design reference data, and stored commentary and part modification requests by persons other than an original designer; and
   (d1) modifying said CAD figure based on a modification command, and modifying said parts list based on said part number, said configuration part number and said attribute data extracted from the modified CAD figure, wherein said modification command indicates a command for modifying design of said part and is inputted through a network when said parts list is disclosed on said network.

10. The parts list generating method according to claim 9, wherein said (b1) step comprises:
    (b11) generating another CAD figure of another part, based on said design reference data, wherein said another CAD figure includes another part number of said another part, other configuration part numbers and other attribute data, said other configuration part numbers are part numbers of other configuration parts of said another part, said other attribute data indicate properties of said another part and said other configuration parts;
    wherein said (c1) step comprises:
    (c11) extracting said another part number, said other configuration part numbers and said other attribute data from said another CAD figure, and modifying said parts list based on said design reference data, said another part number, said other configuration part numbers and said other attribute data extracted from said another CAD figure;
    wherein said (d1) step comprises:
    (d11) modifying said another CAD figure based on another modification command, and modifying said parts list based on said another part number, said other configuration part numbers and said other attribute data extracted from the modified another CAD figure, wherein said another modification command indicates a command for modifying design of said another part and is inputted through said network when said parts list is disclosed on said network.

11. The parts list generating method according to claim 9, further comprising the steps of:
    (e1) generating layout data which indicates a layout of said part in said apparatus, based on said part number, said part data and layout need data, wherein said layout need data relates said part number, said part data, and position and range of said part arranged in said apparatus; and
    (f1) modifying said parts list, based on said layout data.

12. The parts list generating method according to claim 11, further comprising the steps of: (g1) analyzing said part arranged in said apparatus by using an analysis method, based on said parts list and said layout data; and
    (h1) modifying said CAD figure, based on said analysis result.

13. The parts list generating method according to claim 12, further comprising the steps of:
    (i1) estimating manufacture cost which is cost for manufacturing said part, based on said part data and cost data which relates said part data and costs related to manufacturing said part; and
    (j1) modifying said CAD figure based on said manufacture cost.

14. The parts list generating method according to claim 13, further comprising the steps of:
    (k1) generating an entire layout data indicating a layout of all parts in said apparatus, based on said parts list and said layout data of said all parts;
    (l1) modifying said CAD figure of a certain part of said all parts, based on said entire layout data, and extracting said part number, said configuration part numbers and said attribute data regarding said certain part from the modified CAD figure, wherein said certain part should be a changed design, based on said entire layout data; and
    (m1) modifying said parts list, based on said part number, said configuration part numbers and said attribute data extracted from the modified CAD figure.

15. The parts list generating method according to claim 14, further comprising the steps of:
    (n1) checking said part numbers in said parts list, based on a rule for preparing said part number, by performing one or more of a determination of compliance with a part number setting rule, an analysis of digit groups and of grouping of divided figures, and verification of existence;

(o1) generating an output figure interface based on a plurality of packages, wherein said output figure interface is made by reconfiguring said parts list, said plurality of packages are groups including a plurality of said parts and are generated by dividing said all parts into said groups; and (p1) outputting CAD figures for each package, based on said output figure interface, and inspecting said CAD figures.

16. The parts list generating method according to claim 14, further comprising the step of:

extracting data from the modified CAD figure by locating the data within the modified CAD figure using coordinate data, and then reading data from the location specified by the coordinate data.

17. A computer-readable medium having a computer program saved thereupon, said computer program comprising the operations of:

(a2) generating a parts list of an apparatus, based on design reference data, wherein said parts list relates a part number, configuration part numbers and part data, said part is included in said apparatus, said configuration part numbers are part numbers of configuration parts of said part, said part data indicate properties of said part and said configuration parts, and said design reference data are references for designing said apparatus;

(b2) generating a CAD figure of said part, based on said design reference data and said part number, and extracting said part number, said configuration part numbers and attribute data from said CAD figure, wherein said CAD figure includes said part number, said configuration part numbers and said attribute data, said attribute data indicate properties of said part and said configuration parts included in said part data;

(c2) modifying said parts list based on said part number, said configuration part numbers and said attribute data from a modified CAD figure, said design reference data, and stored commentary and part modification requests by persons other than an original designer; and (d2) modifying said CAD figure based on a modification command, and modifying said parts list based on said part number, said configuration part number and said attribute data extracted from the modified CAD figure, wherein said modification command indicates a command for modifying design of said part and is inputted through a network when said parts list is disclosed on said network.

18. The computer-readable medium according to claim 17, wherein said computer program further comprises the operations of:

(e2) generating layout data which indicates a layout of said part in said apparatus, based on said part number, said part data and layout need data, wherein said layout need data relates said part number, said part data, and position and range of said part arranged in said apparatus; and (f2) modifying said parts list, based on said layout data.

19. The computer-readable medium according to claim 18, wherein said computer program further comprises the operations of:

(g2) analyzing said part arranged in said apparatus by using an analysis method, based on said parts list and said layout data; and (h2) modifying said CAD figure, based on said analysis result.

20. The computer-readable medium according to claim 19, wherein said computer program further comprises the operations of:

(i2) estimating manufacture cost which is cost for manufacturing said part, based on said part data and cost data which relates said part data and costs related to manufacturing said part; and (j2) modifying said CAD figure based on said manufacture cost.

21. The computer-readable medium according to claim 20, wherein said computer program further comprises the operations of:

(k2) generating an entire layout data indicating a layout of all parts in said apparatus, based on said parts list and said layout data of said all parts;

(l2) modifying said CAD figure of a certain part of said all parts, based on said entire layout data, and extracting said part number, said configuration part numbers and said attribute data regarding said certain part from the modified CAD figure, wherein said certain part should be a changed design, based on said entire layout data; and (m2) modifying said parts list, based on said part number, said configuration part numbers and said attribute data extracted from the modified CAD figure.

22. The computer-readable medium according to claim 21, wherein said computer program further comprises the operations of:

(n2) checking said part numbers in said parts list, based on a rule for preparing said part number, by performing one or more of a determination of compliance with a part number setting rule, an analysis of digit groups and of grouping of divided figures, and verification of existence;

(o2) generating an output figure interface based on a plurality of packages, wherein said output figure interface is made by reconfiguring said parts list, said plurality of packages are groups including a plurality of said parts and are generated by dividing said all parts into said groups; and (p2) outputting CAD figures for each package, based on said output figure interface, and inspecting said CAD figures.

23. The computer-readable medium according to claim 21, wherein said computer program further comprises the operation of:

extracting data from the modified CAD figure by locating the data within the modified CAD figure using coordinate data, and then reading data from the location specified by the coordinate data.

* * * * *